US009861139B2

(12) United States Patent
Boldrini

(10) Patent No.: US 9,861,139 B2
(45) Date of Patent: Jan. 9, 2018

(54) MACHINE AND METHOD FOR PRODUCING A CARTRIDGE FOR AN ELECTRONIC CIGARETTE

(71) Applicant: G.D SOCIETA' PER AZIONI, Bologna (IT)

(72) Inventor: Fulvio Boldrini, Ferrara (IT)

(73) Assignee: G.D SOCIETA' PER AZIONI, Bologna (IT)

( * ) Notice: Subject to any disclaimer, the term of this patent is extended or adjusted under 35 U.S.C. 154(b) by 281 days.

(21) Appl. No.: 14/951,802

(22) Filed: Nov. 25, 2015

(65) Prior Publication Data

US 2016/0143363 A1 May 26, 2016

(30) Foreign Application Priority Data

Nov. 26, 2014 (IT) .............................. BO2014A0665

(51) Int. Cl.
*A24F 47/00* (2006.01)
*B23P 21/00* (2006.01)
*H05K 13/00* (2006.01)

(52) U.S. Cl.
CPC .......... *A24F 47/008* (2013.01); *B23P 21/004* (2013.01); *H05K 13/003* (2013.01); *H05K 13/0023* (2013.01)

(58) Field of Classification Search
CPC . A24F 47/008; B23P 21/004; H05K 13/0023; H05K 13/003
See application file for complete search history.

(56) References Cited

U.S. PATENT DOCUMENTS

2014/0270730 A1   9/2014  DePiano et al.
2017/0006921 A1*  1/2017  Lemay ................. A24F 47/008

FOREIGN PATENT DOCUMENTS

| CN | 201758770 U | 3/2011 |
| EP | 2 779 786 A1 | 9/2014 |
| WO | WO-2013/076750 A1 | 5/2013 |
| WO | WO-2014/058678 A1 | 4/2014 |
| WO | WO-2014/088889 A1 | 6/2014 |

* cited by examiner

Primary Examiner — Carl Arbes
(74) Attorney, Agent, or Firm — Marshall, Gerstein & Borun LLP

(57) ABSTRACT

A manufacturing machine and a method for producing a cartridge for an electronic cigarette comprising a supporting base and at least one electrode fitted to the supporting base are disclosed: a conveyor, which comprises a pocket for feeding the supporting base along a conveying path; a gripping device for gripping the electrode; and an actuating device, which moves the gripping device cyclically back and forth in a fitting direction perpendicular to the conveying path, so as to fit the electrode gripped by the gripping device to the supporting base during a forward stroke and to detach the gripping device from the electrode fitted to the supporting base during a return stroke.

12 Claims, 30 Drawing Sheets

MACHINE AND METHOD FOR PRODUCING A CARTRIDGE FOR AN ELECTRONIC CIGARETTE

CROSS-REFERENCE TO RELATED APPLICATIONS

This application claims the benefit of Italian Patent application No. BO2014A000665, filed Nov. 26, 2014.

TECHNICAL FIELD

The present invention relates to a machine and to a method for producing a cartridge for an electronic cigarette.

PRIOR ART

Recently, an electronic cigarette has been proposed (described, for example, in the patent applications WO2014058678A1 and WO2014088889A1) comprising a cylindrical shaped reusable part that is used several times and contains, among other things, an electric battery (which provides energy necessary for the electronic cigarette to operate) and an electronic processor which supervises the electronic cigarette operation. In addition, the electronic cigarette comprises a single-use cartridge (i.e. disposable and therefore used only once and then replaced) cylindrical in shape which is screwed to the reusable part.

The cartridge comprises a supporting base, which is made of plastic material (electrically insulating) and is inserted inside an internally threaded metal base to obtain the mechanical connecting with the corresponding reusable part of the electronic cigarette. The supporting base has two power electrodes arranged at the sides and having a greater axial extent and a signal electrode arranged centrally (i.e. between the two power electrodes) and having a smaller axial extent (with respect to the two power electrodes). A heating member is electrically connected to the two power electrodes comprising a 'U'-folded wick of electrically insulating material and a heat resistor made of a filament wound in a spiral about the wick; at the two opposite ends of the filament two terminals are formed which are electrically connected to corresponding power electrodes by means of welding.

Between the two power electrodes a supporting body of ceramic material (or similar) is arranged, which rests laterally on both power electrodes and is centrally fitted with an electronic circuit, which is electrically connected to the signal electrode and comprises, among other things, a memory.

Finally, inside the base a hygroscopic pad (e.g. a cotton wool pad) is also arranged which is impregnated with a viscous liquid substance containing the nicotine and possible flavourings. The hygroscopic pad has a cylindrical tubular shape and surrounds the heat resistance of the heating member so that in use the heat generated by the heating member would heat the hygroscopic pad causing the slow volatilization (vaporization) of the viscous liquid substance which impregnates the hygroscopic pad.

Currently, the production of a cartridge as described above provides the withdrawal of the three electrodes from corresponding three depositories of electrodes (in which the preformed electrodes are arranged in bulk) and to feed the electrodes coming from the depositories to corresponding mobile connecting members; a supporting base is brought in front of each connecting member so that the connecting member with an axial movement with respect to the supporting base can fit (with a certain force to obtain an interference fitting) the corresponding electrode in a preformed hole of the supporting base.

However, it has been observed that said production methods of the cartridge have the drawback of being not very efficient, since to maintain acceptable production quality it is necessary to operate very slowly (i.e. with a very low hourly productivity). In addition, with a certain frequency damage of the electrodes (essentially unwanted deformations of the electrodes themselves) occurs during the handling of the electrodes necessary for moving the electrodes from the depositories to the connecting member.

DESCRIPTION OF THE INVENTION

The object of the present invention is to provide a machine and a method for producing a cartridge for an electronic cigarette, which machine and method allow to reach high productivity levels, and are, at the same time, easy and inexpensive to manufacture.

According to the present invention, a machine and a method for producing a cartridge for an electronic cigarette are provided, as claimed in the attached claims.

BRIEF DESCRIPTION OF THE DRAWINGS

The present invention will now be described with reference to the accompanying drawings, which illustrate a non-limitative embodiment, wherein.

PREFERRED EMBODIMENTS OF THE INVENTION

Figure 1:
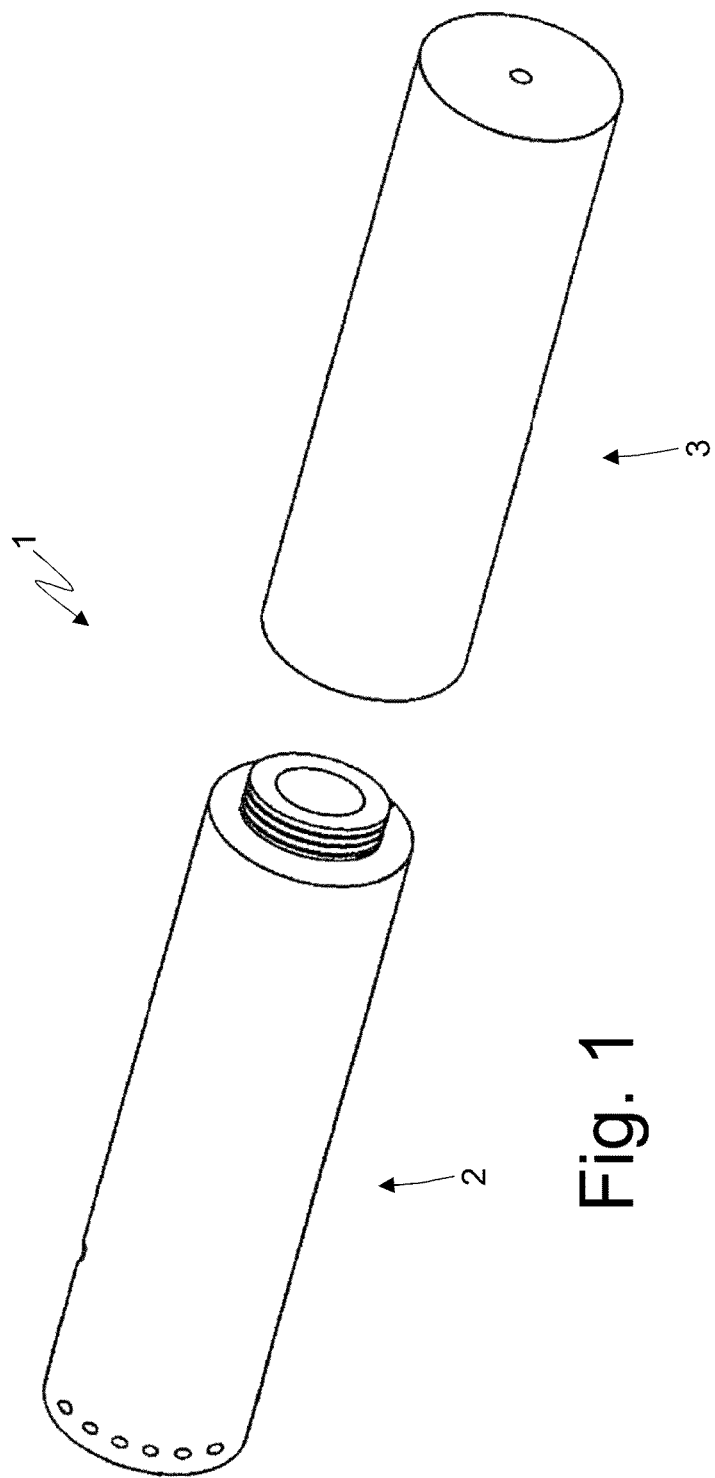
FIG. 1 is a perspective and schematic view of an electronic cigarette provided with a cartridge.

In FIG. 1, reference number 1 indicates as a whole an electronic cigarette of known type (described, for example, in patent applications WO2014058678A1 and WO2014088889A1).

The electronic cigarette 1 comprises a reusable part 2 cylindrical in shape that is used several times and contains, among other things, an electric battery (which provides the energy required for the electronic cigarette 1 to operate) and an electronic processor which supervises the operation of the electronic cigarette 1. In addition, the electronic cigarette comprises a single-use cartridge 3 (i.e. disposable and therefore used only once and then replaced) and cylindrical in shape which is screwed to the reusable part 2.

Figure 2:
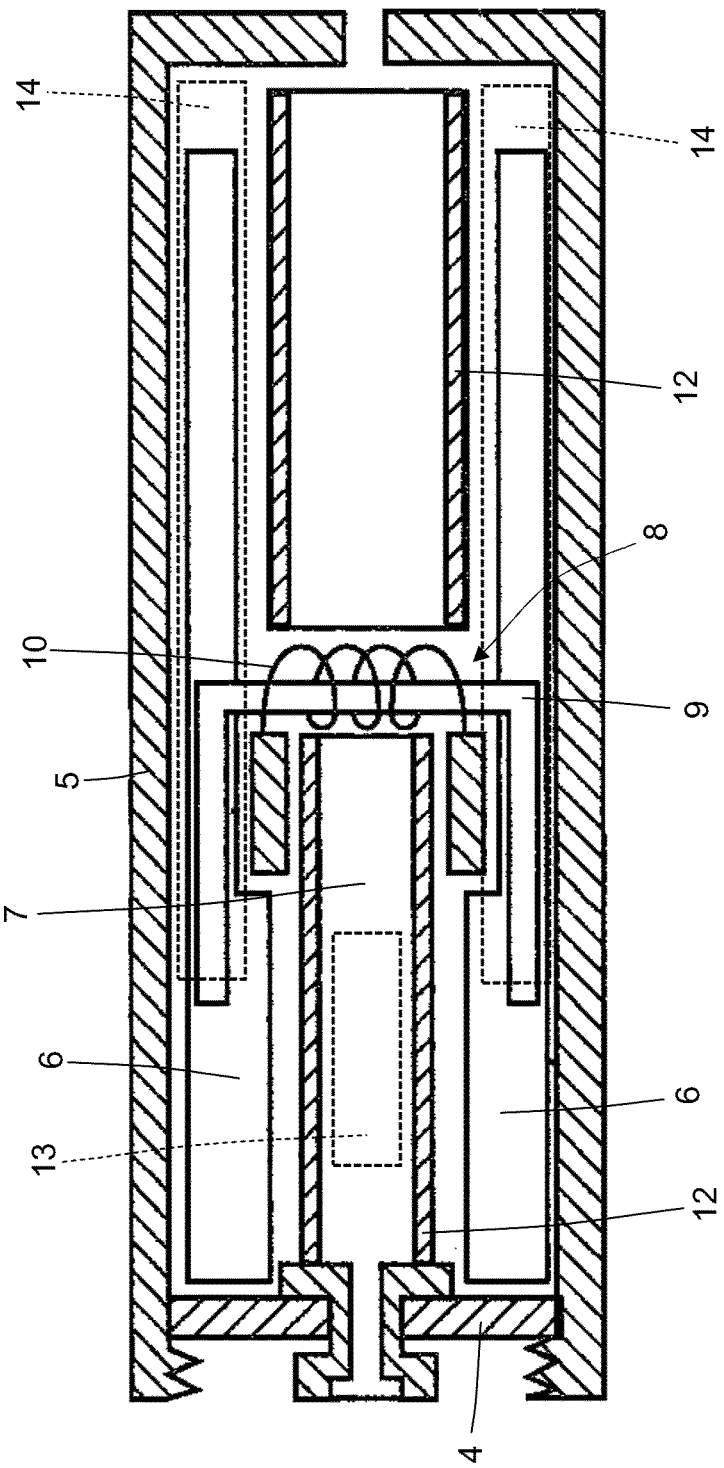
FIG. 2 is a longitudinal sectional and schematic view of the cartridge of FIG. 2.
Figure 3:
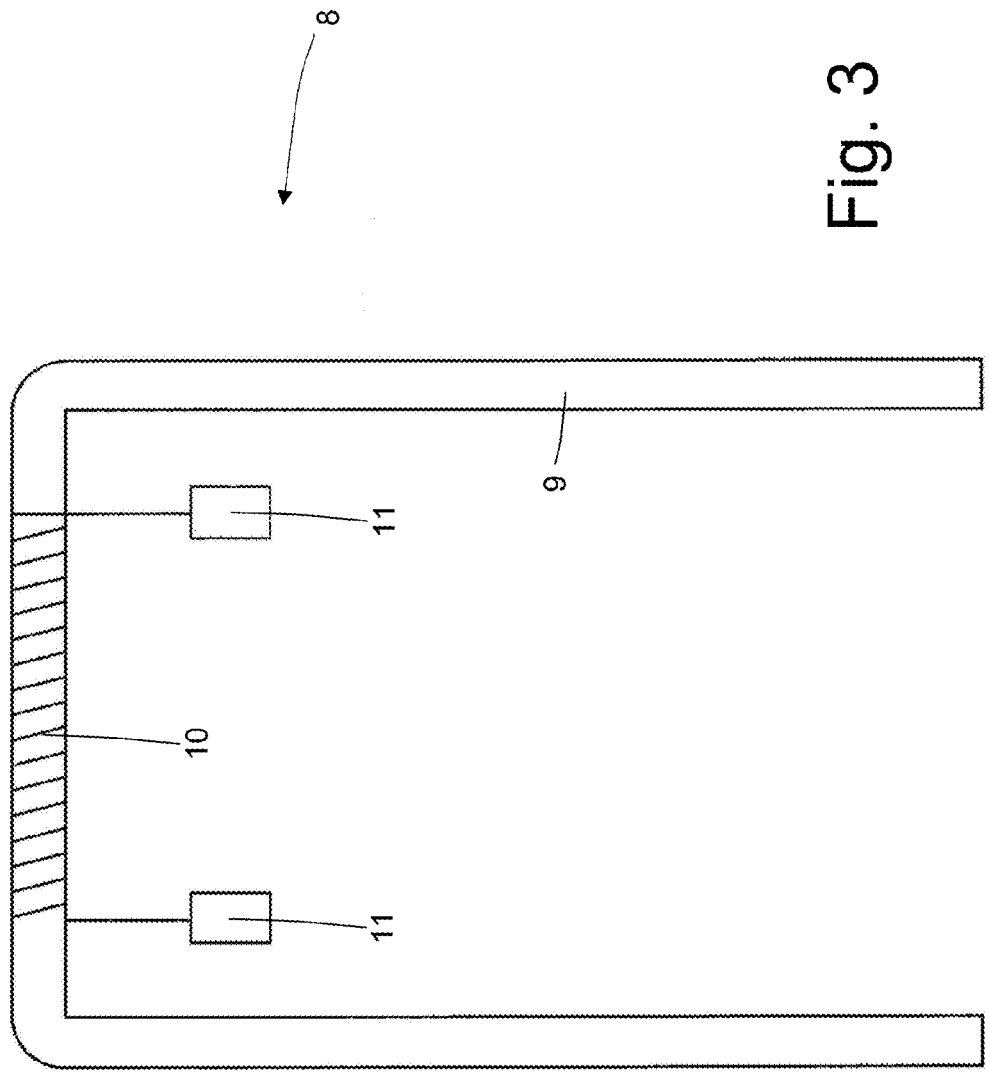
FIG. 3 is a schematic view of a heating member of the cartridge of FIG. 2.
Figure 4:
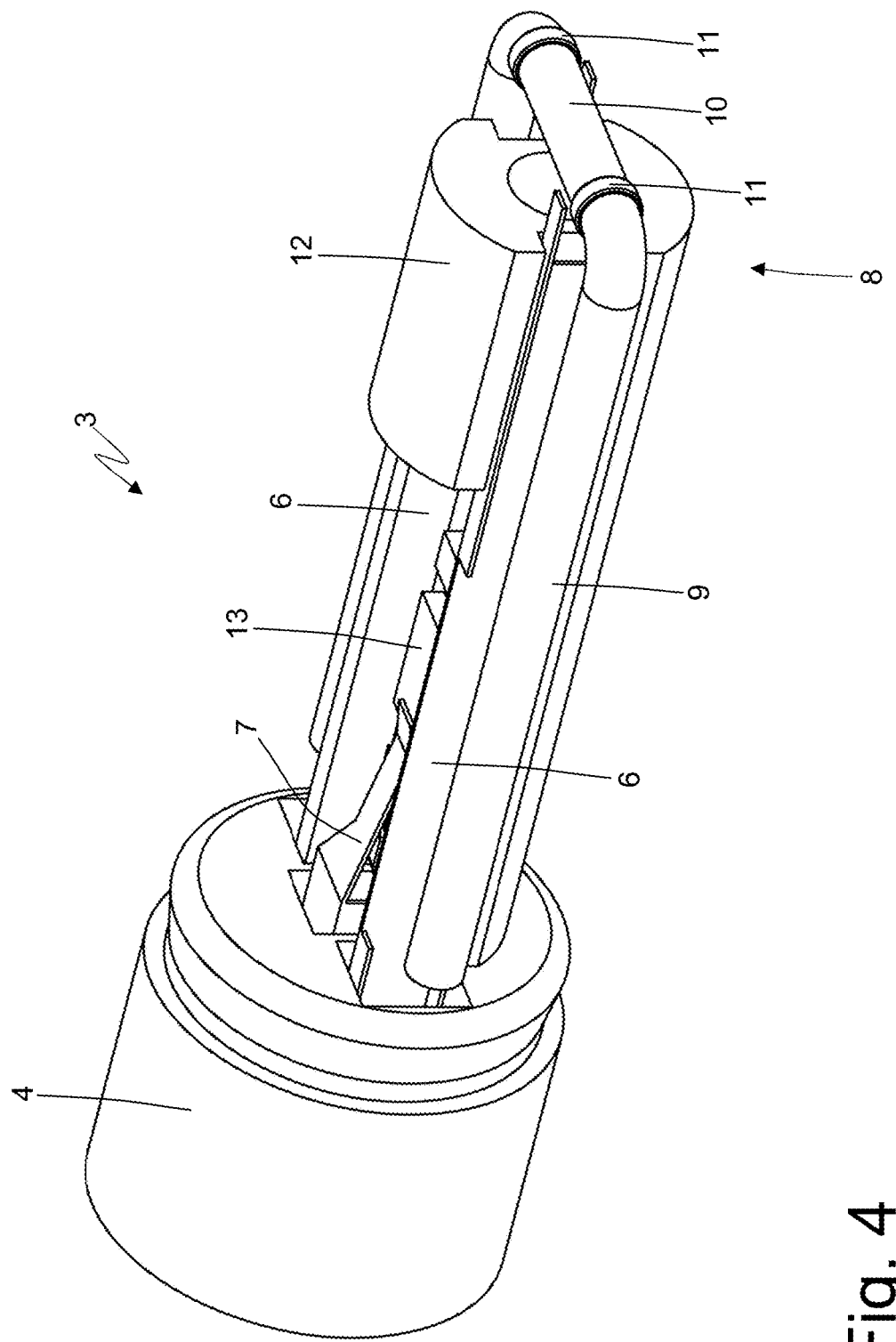
FIGS. 4 and 5 are two different perspective and schematic views of the cartridge of FIG. 2 with parts removed for clarity.

As illustrated in FIG. 2, the cartridge 3 of the electronic cigarette 1 comprises a supporting base 4, which is made of plastic material (electrically insulating) and is at least partly forcibly inserted (i.e. fitted lightly interfering) inside a metal base 5 internally threaded to obtain the mechanical connecting with the corresponding reusable part 2 of the electronic cigarette 1. The supporting base 4 is fitted with two power electrodes 6 arranged at the sides and having a greater axial extent and a signal electrode 7 arranged centrally (i.e. between the two power electrodes 6) and having a smaller axial extent (with respect to the two power electrodes 6). To the two power electrodes 6 a heating member (better illustrated in FIG. 3) is electrically connected, which comprises a U-folded wick 9 of electrically insulating material and a heat resistor 10 formed by a filament wound in a spiral about the wick 9; at the two opposite ends of the filament two terminals 11 are formed which are electrically connected to the corresponding power electrodes 6 by means of welding.

Between the two power electrodes 6 a supporting body 12 of ceramic material (or similar) is arranged, which rests laterally on both power electrodes 6 and is centrally fitted with an electronic circuit 13, which is electrically connected with the signal electrode 7 and comprises, among other things, a memory. The supporting body 12 also has the function of insulating spacer to keep well separated the two power electrodes 6 from each other. Finally, inside the base 5 a hygroscopic pad 14 (e.g. a cotton wool pad) is arranged, which is impregnated with a viscous liquid substance containing the nicotine and possible flavourings. The hygroscopic pad 14 has a cylindrical tubular shape and surrounds the heat resistance 10 of the heating member 8 so that in use the heat generated by the heating member 8 heats the hygroscopic pad 14 causing the slow volatilization (vaporization) of the viscose liquid substance impregnating the hygroscopic pad 14. In particular, in the embodiment illustrated in FIG. 2 the hygroscopic pad it is arranged (wound) about the two power electrodes 6 (i.e. externally to the power electrodes 6). Preferably, and as better described below, the hygroscopic pad 14 is obtained by ring-folding an initially flat piece of hygroscopic material.

Figure 6:
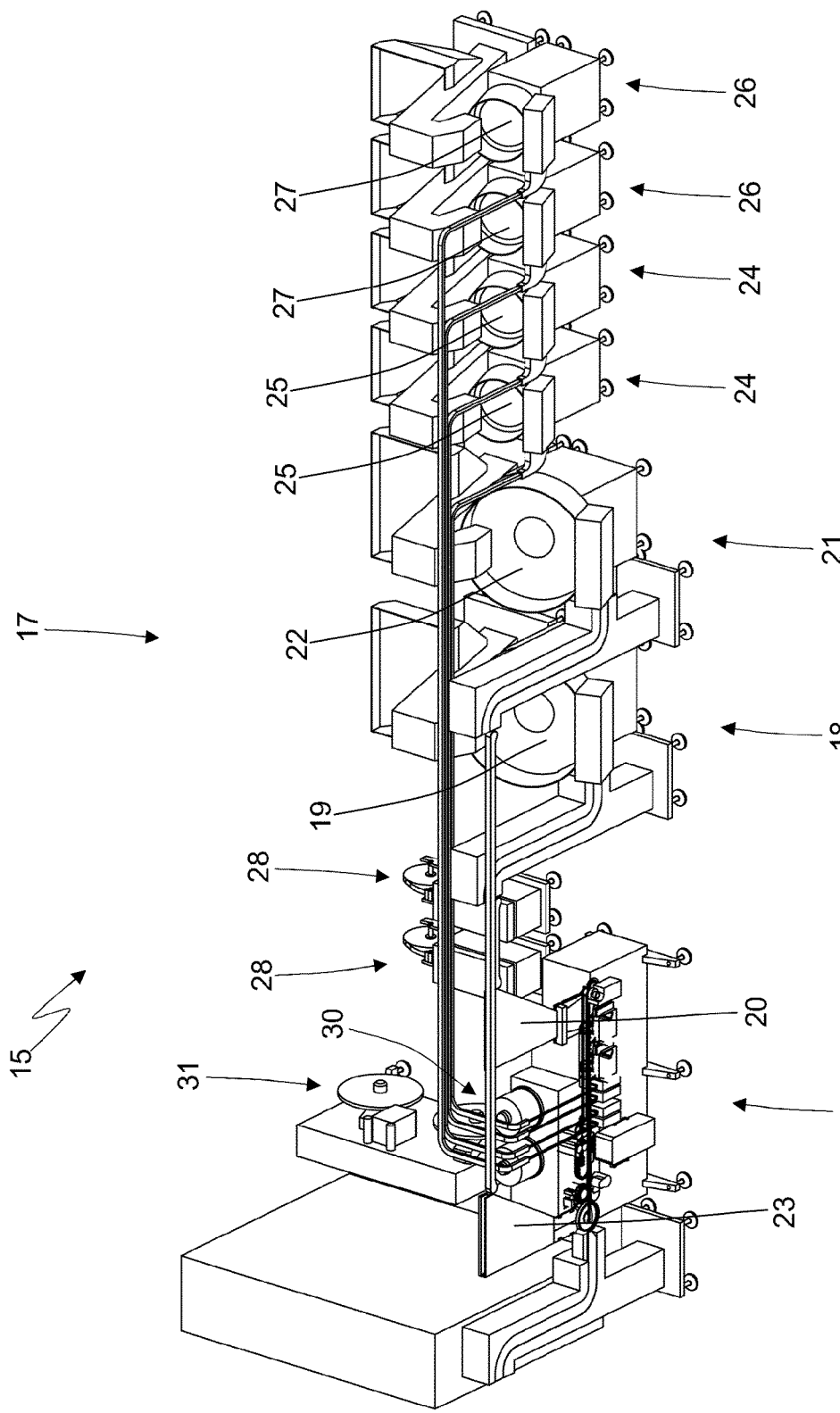
FIG. 6 is a perspective and schematic view of a manufacturing machine for producing the cartridge of FIG. 2 and manufactured according to the present invention.
Figure 7:
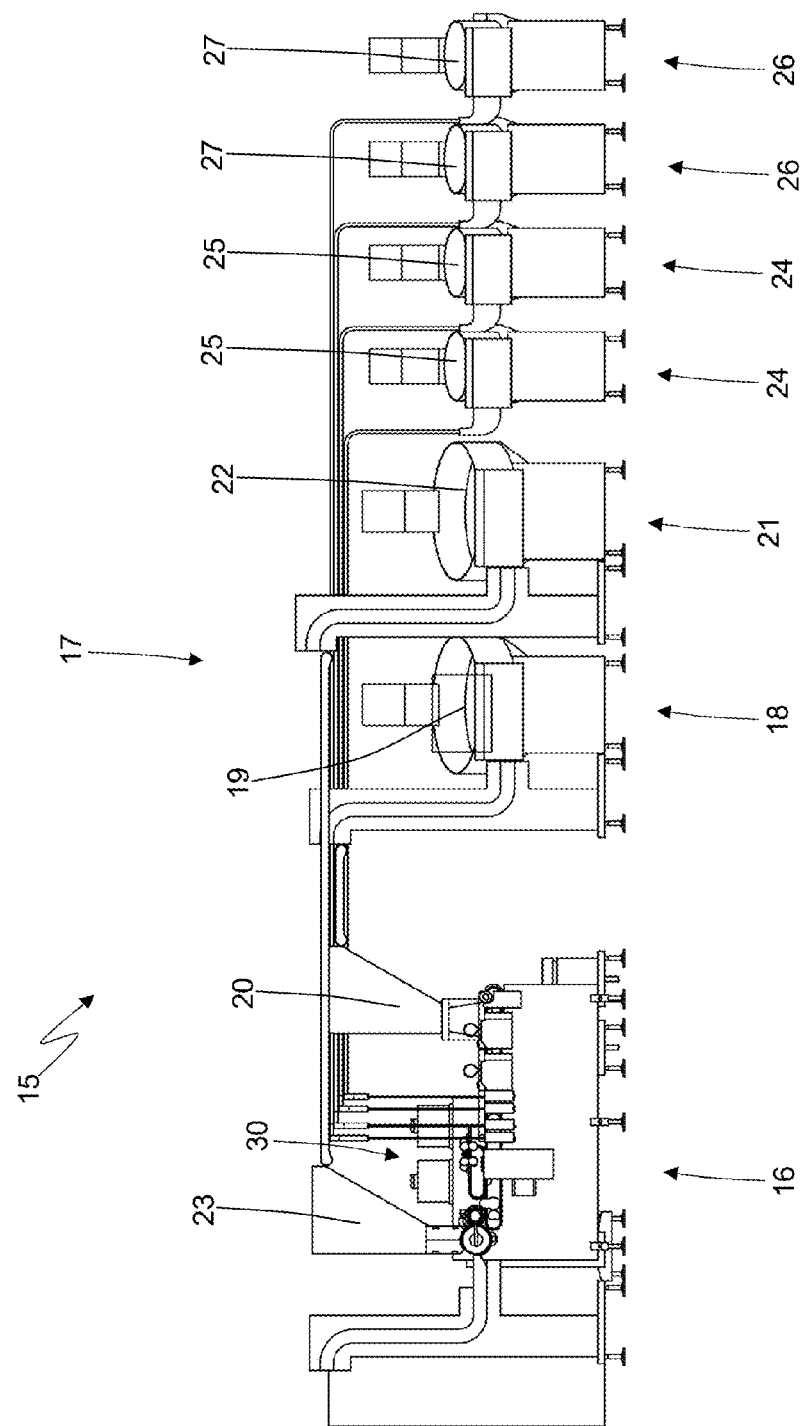
FIG. 7 is a front and schematic view of the manufacturing machine of FIG. 6.
Figure 8:
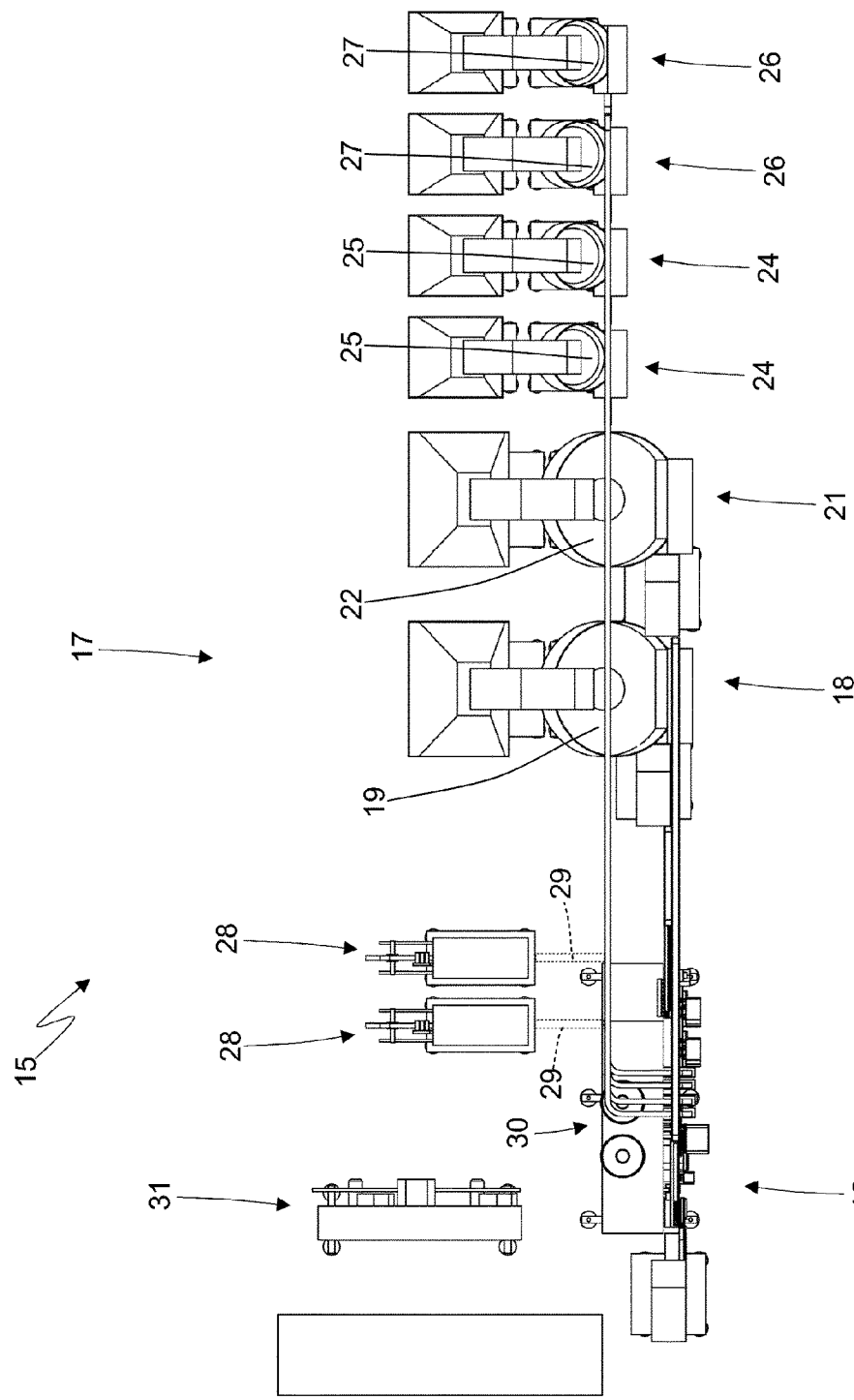
FIG. 8 is a top plan and schematic view of the manufacturing machine of FIG. 6.

In FIGS. 6, 7 and 8 reference number 15 indicates as a whole a manufacturing machine for producing cartridges 2 for electronic cigarettes described above.

The manufacturing machine 15 comprises an assembly section 16 in which the materials forming the cartridges 2 are assembled to manufacture the cartridges 2 and a feed section 17, in which the materials forming the cartridges 2 are received and guided towards the assembly section 16.

The feed section 17 of the manufacturing machine 15 comprises a feed device 18 for feeding the supporting bases 4, which receives a random mass of supporting bases 4 (i.e. a mass of supporting bases 4 arranged in bulk) in a collecting tank 19 open at the top and manipulates the supporting bases 4 to arrange the supporting bases 4 in an orderly succession which is then fed to a hopper 20 of the assembly section 16 of the manufacturing machine 15 by means of a mechanical type air conveyor.

The feed section 17 comprises a feed device 21 for feeding the bases 5, which receives a random mass of bases 5 (i.e. a mass of bases 5 arranged in bulk) in a collecting tank 22 open at the top and manipulates the bases 5 to place the bases 5 in an orderly succession which is then fed to a hopper 23 of the assembly section 16 of the manufacturing machine 15 by means of a mechanical type air conveyor.

The feed section 17 of the manufacturing machine 15 comprises two feed devices 24 for feeding the electronic circuits 13, which are twins to be used in alternative (i.e. a single feed device 24 at a time is always used). Each feed device 24 receives a random mass of electronic circuits 13 (i.e. a mass of electronic circuits 13 arranged in bulk) in a collecting tank 25 open at the top and manipulates the electronic circuits 13 to arrange the electronic circuits 13 in an orderly succession which is then fed to the assembly section of the manufacturing machine 15 by means of a pneumatic type aerial conveyor.

The feed section 17 of the manufacturing machine 15 comprises two feed devices 26 for feeding the supporting bodies 12, which are twins to be used in alternative (i.e. a single feed device 26 at a time is always used). Each feed device 26 receives a random mass of supporting bodies 12 (i.e. a mass of supporting bodies 12 arranged in bulk) in a collecting tank 27 open at the top and manipulates the supporting bodies 12 to arrange the supporting bodies 12 in an orderly succession which is then fed to the assembly section 16 of the manufacturing machine 15 by means of a pneumatic type aerial conveyor.

The feed section 17 of the manufacturing machine 15 comprises two feed devices 28 of respective sheet metal strips 29 (schematically illustrated in FIG. 8) which, as better described hereinafter, are made of metallic material and are used to form the electrodes 6 and 7; the two feed devices 28 are twins and used in alternative (i.e. a single feed device at a time is always used). Each feed device 28 houses a corresponding coil on which a sheet metal strip 29 is wound and unwinds the sheet metal strip 29 from the coil to be fed towards the assembly section 16 of the manufacturing machine 15.

The feed section 17 of the manufacturing machine 15 comprises a single feed device 30 for feeding the heating members 8. The feed device 30 houses two coils which are used in alternative (i.e. a single coil at a time is always used) and in each of which a succession of heating members 8 is wound; the feed device 30 unwinds a coil at a time to feed the succession of heating members 8 towards the assembly section 16 of the manufacturing machine 15.

The feed section 17 of the manufacturing machine 15 comprises a single feed device 31 for feeding the hygroscopic pads 14. The feed device 31 houses two coils which are used in alternative (i.e. a single coil at a time is always used) and on each of which a continuous strip of hygroscopic material is wound; the feed device 31 unwinds a coil at a time to feed the continuous strip of hygroscopic material towards the assembly section 16 of the manufacturing machine 15.

Figure 9:
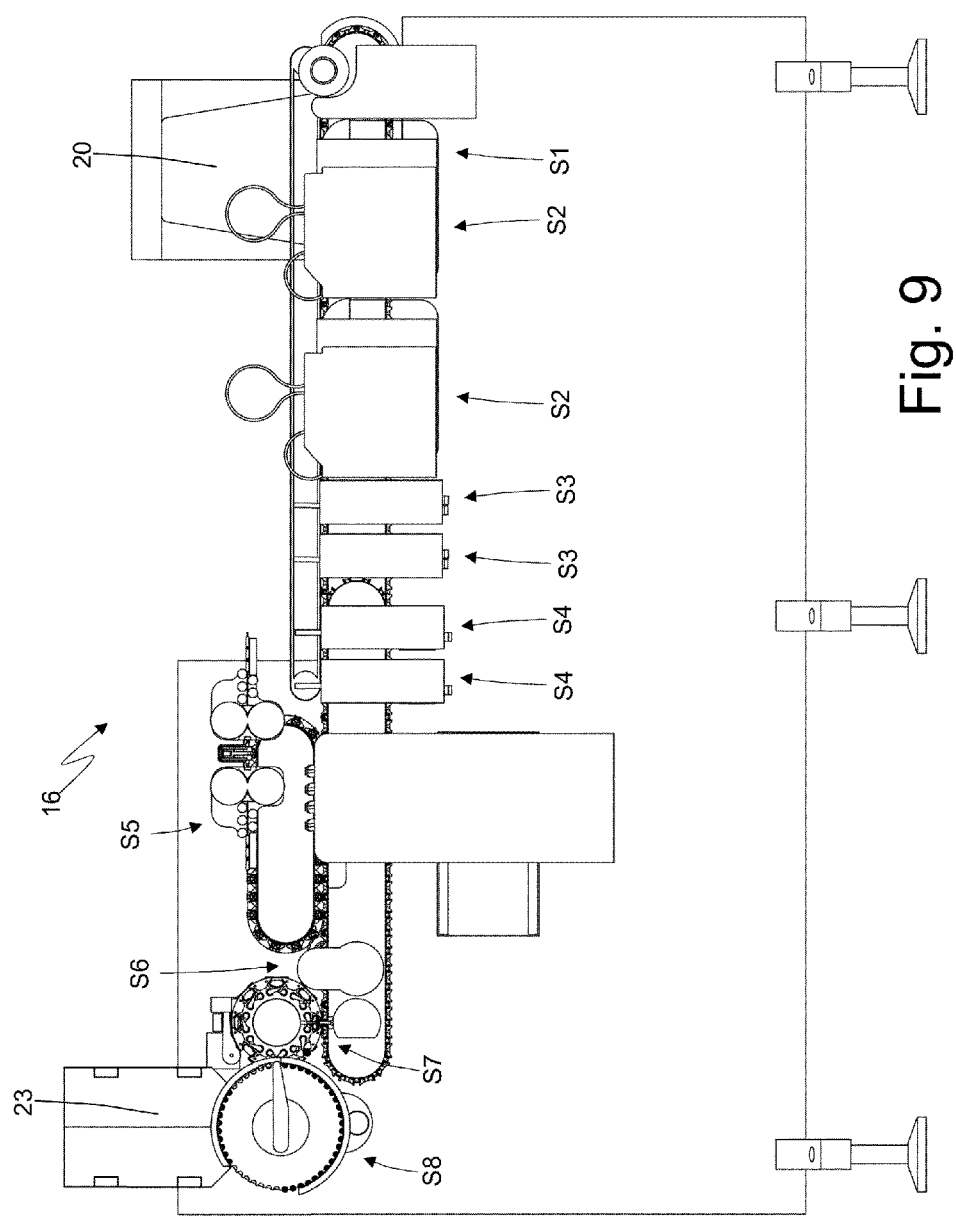
FIG. 9 is a front and schematic view of an assembly section of the manufacturing machine of FIG. 6.
Figure 10:
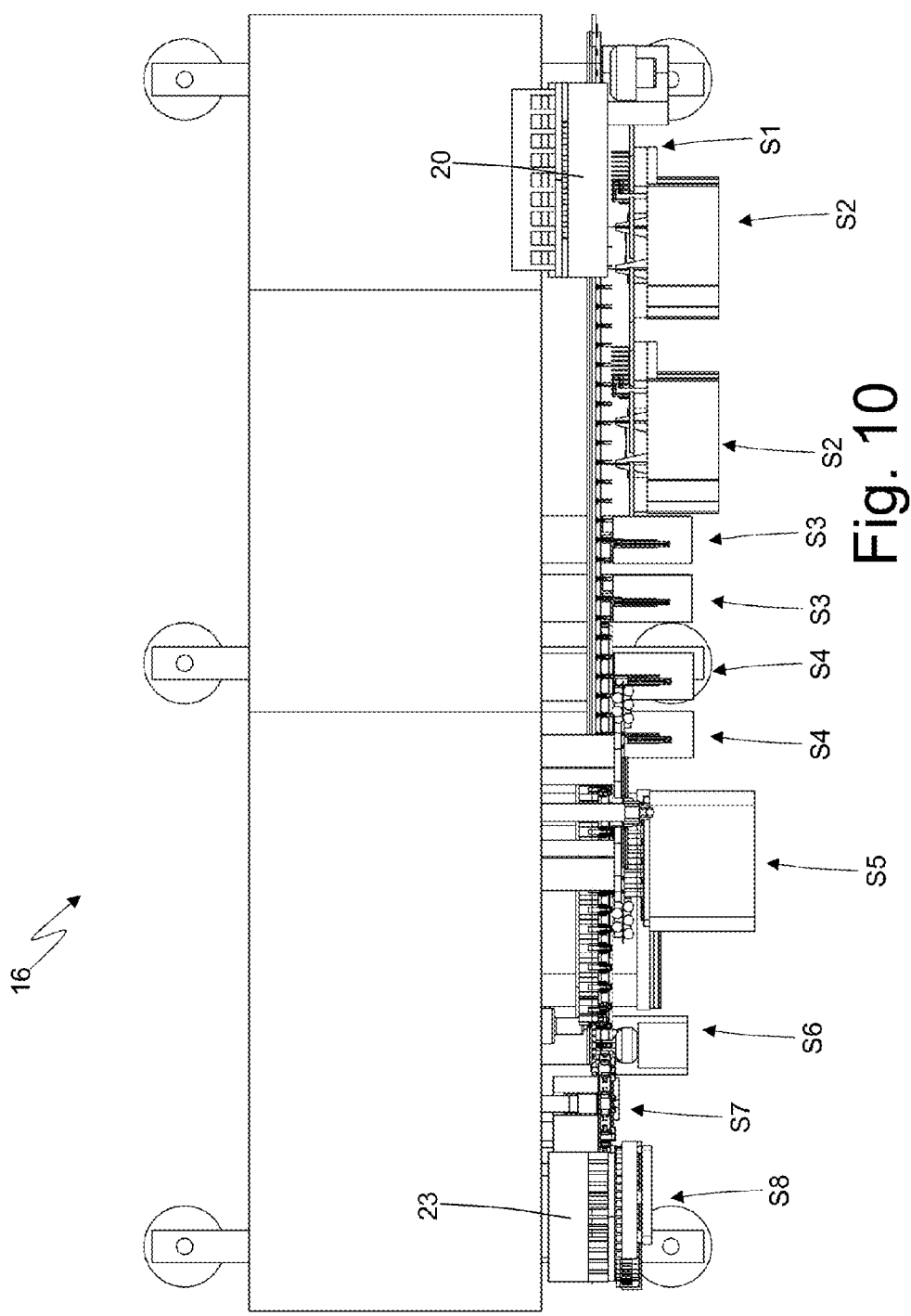
FIG. 10 is a top plan and schematic section of the assembly of FIG. 9.

As illustrated in FIGS. 9 and 10, the assembly section 16 of the manufacturing machine 15 comprises a receiving station S1 of the supporting bases 4, a pair of application stations S2 for applying the electrodes 6 and 7 (redundant one with the other), a pair of application stations S3 for applying the electronic circuits 13 (redundant one with the other), a pair of application stations S4 for applying the supporting bodies (redundant one with the other), an application station S5 for applying the heating members 8, a rotation station S6, an application station S7 for applying the hygroscopic pads 14 and an application station S8 for applying the bases 5.

Figure 11:
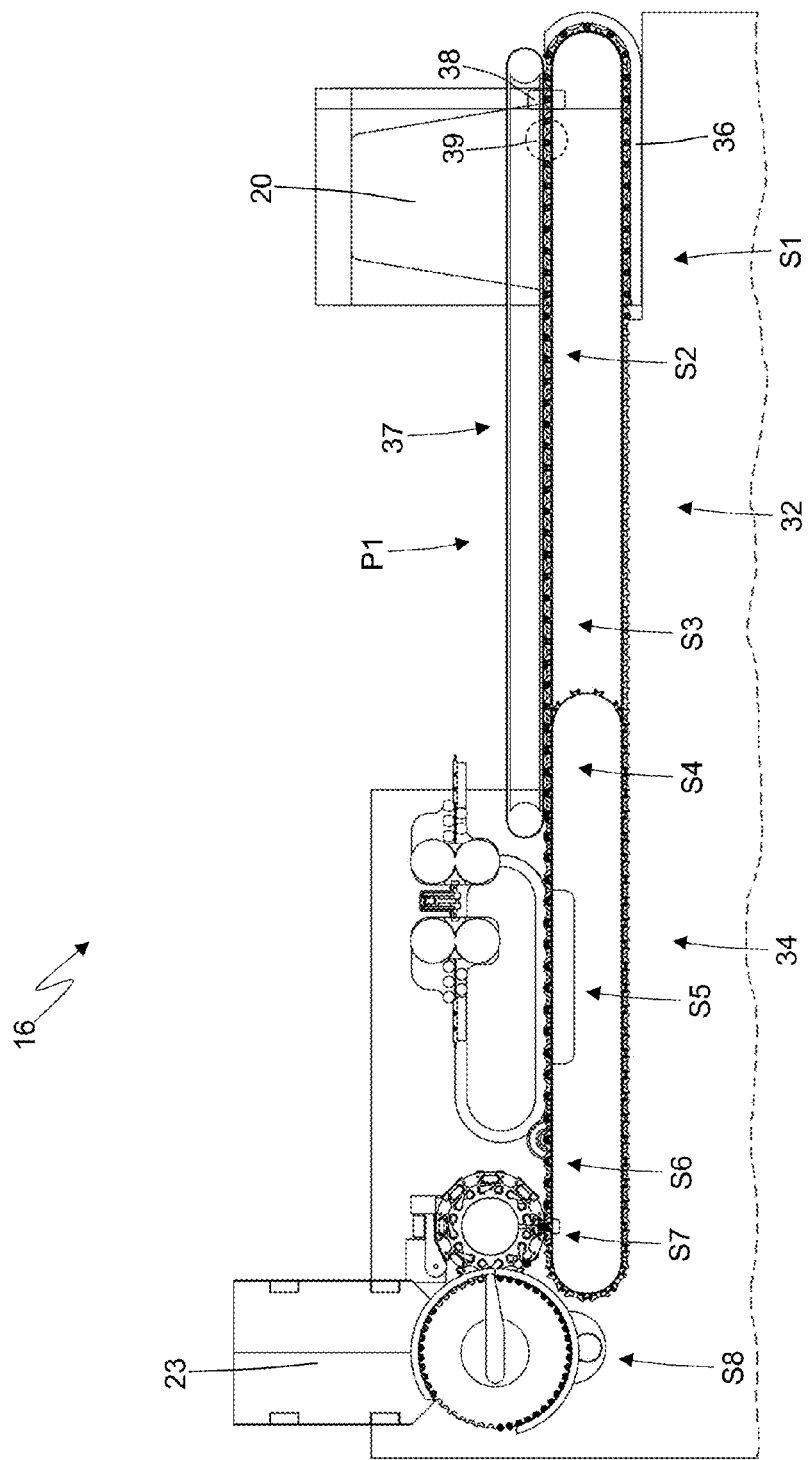
FIG. 11 is a front and schematic view of some conveyors of the assembly section of FIG. 9.
Figure 12:
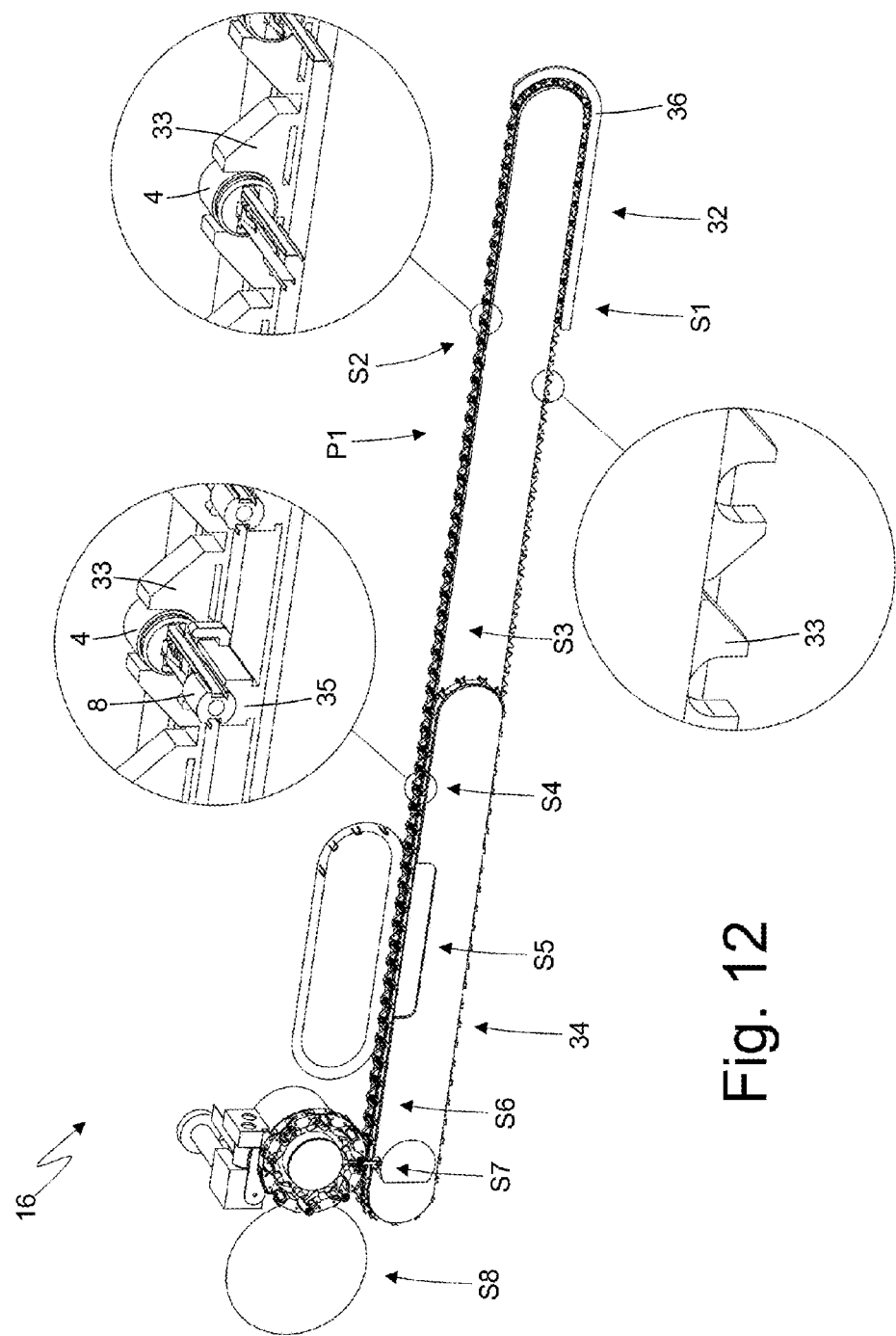
FIG. 12 is a perspective and schematic view of the conveyors of FIG. 11.

As illustrated in FIGS. 11 and 12, the assembly section 16 of the manufacturing machine 15 comprises a conveyor 32, which comprises a number of pockets 33 (better illustrated in FIG. 12) for housing the supporting bases 4 fed with intermittent motion (stepped) along a U-shaped conveying path P1 that extends from the receiving station S1 towards the connecting station S7; in particular, the conveying path P1 comprises two rectilinear sections (arranged one above the other and of different length) connected to each other by a semicircular portion. The intermittent motion (stepped) provides to cyclically alternate motion steps wherein the conveyor 32 moves the pockets 33 and resting steps wherein the conveyor 32 keeps the pockets 33 still. In the embodiment illustrated in the attached figures, the conveyor 32 is a belt conveyor and comprises a flexible belt supporting the pockets 33 and is closed in a loop about two end pulleys (at least one of which is motorized).

According to a preferred embodiment, an accompanying conveyor 34 is provided, which is arranged next to the conveyor 32 starting from the application station S4 up to the application station S7, it moves in a synchronized manner with the accompanying conveyor 34, and comprises a number of pockets 35 (better illustrated in FIG. 12) to provide a support for the supporting bodies 12 that protrude cantilevered from the corresponding supporting bases 4 fitted on the pockets 33 of the conveyor 32. In the embodiment illustrated in the attached figures, the conveyor 34 is a belt conveyor and comprises a flexible belt that supports the pockets 35 and is closed in a loop about two end pulleys (at least one of which is motorized).

As illustrated in FIGS. 11 and 12, about the initial part of the conveying path P1 a fixed containment element 36 is arranged, which is U-shaped and keeps the supporting bases 4 inside the corresponding pockets 33 of the conveyor 32. Moreover, at an intermediate part of the conveying path P1 a further accompanying conveyor 37 is arranged located above the conveyor 32 and keeps the supporting bases 4 inside the corresponding pockets 33 of the conveyor 32 itself. In the embodiment illustrated in the attached figures, the accompanying conveyor 37 is a belt conveyor and comprises a flexible belt which is closed in a loop about two end pulleys (at least one of which is motorized).

As illustrated in FIG. 11, the conveying path P1 starts at the lower outlet mouths of the hopper 20; some pushers (for example ten side by side pushers) having a reciprocating movement along a direction perpendicular to conveying path P1 cyclically push a number of supporting bases 4 out of the lower outlet mouths of the hopper 20 until being inserted into corresponding pockets 33 of the conveyor 32.

As illustrated in FIG. 11, the receiving station S1 comprises an optical control device 38 (for example a CCD camera) that "watches" the supporting bases 4 to determine the orientation of each supporting base 4 (in particular for determining the orientation of the electrical connection holes of the supporting base 4 made to receive the electrodes 6 and 7). Furthermore, as illustrated in FIG. 11, the receiving station S1 comprises a guiding device 39, which is controlled as a function of the detections performed by the optical control device 38 and applies, as required, to each supporting base 4 a rotation to confer the supporting base 4 itself a desired and predetermined orientation (in particular to confer the electrical connection holes of the supporting base 4 made to receive the electrodes 6 and 7 a desired and predetermined orientation). According to a possible embodiment, the guiding device 39 comprises a rotatable fork which is axially movable for fitting into the electrical connection holes of the supporting base 4 to grip the supporting base 4 and being able, therefore, to rotate the supporting base 4 itself. Thanks to the combined action of the optical control device 38 and of the guiding device 39, at the entrance of the application station S2 of the electrodes 6 and 7, the supporting bases 4 all have a predetermined desired orientation thus simplifying the insertion of the electrodes 6 and 7 in the supporting bases 4 themselves.

Figure 13:
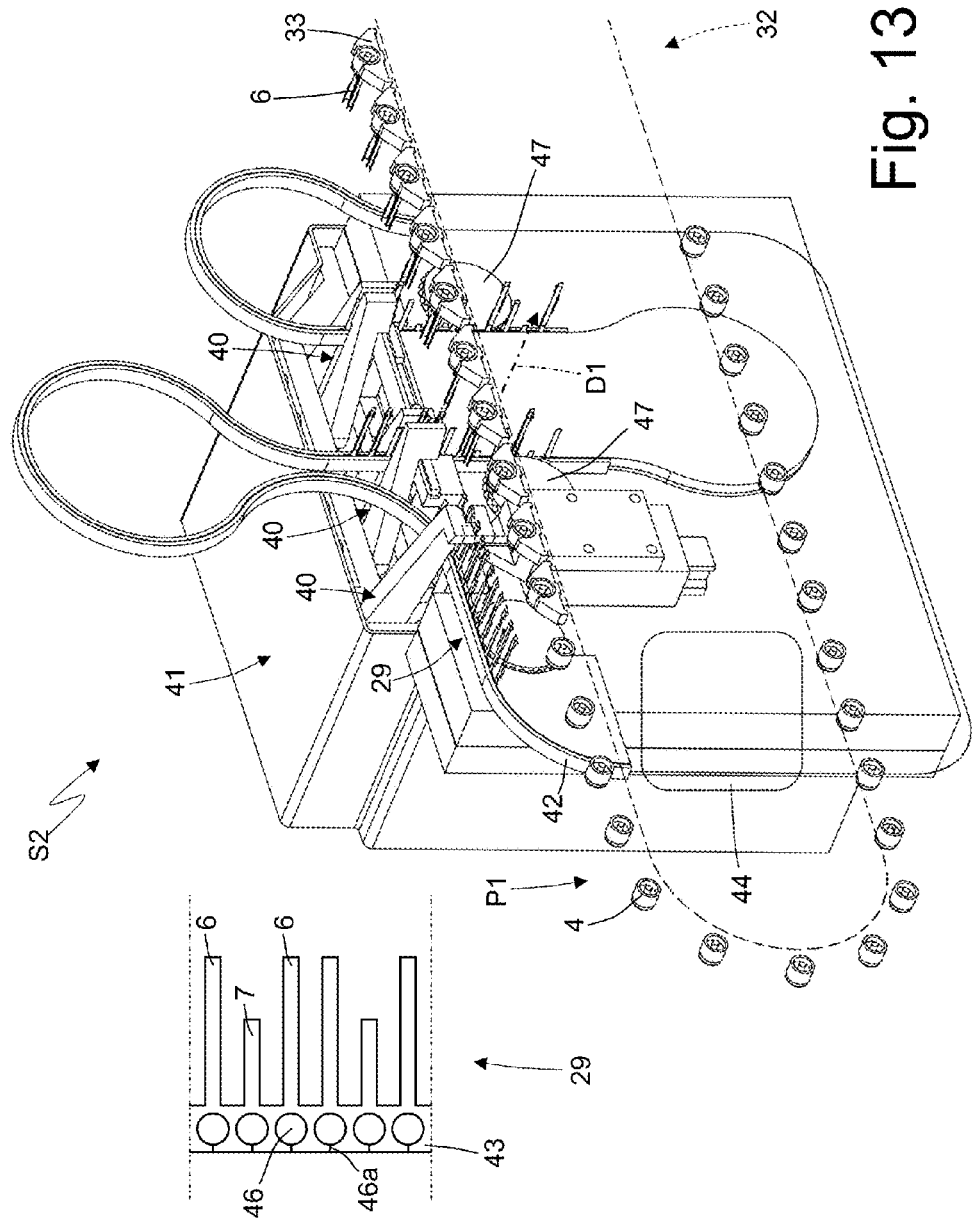
FIG. 13 is a perspective and schematic view of an application station for applying the electrical contacts of the section assembly of FIG. 9.
Figure 14:
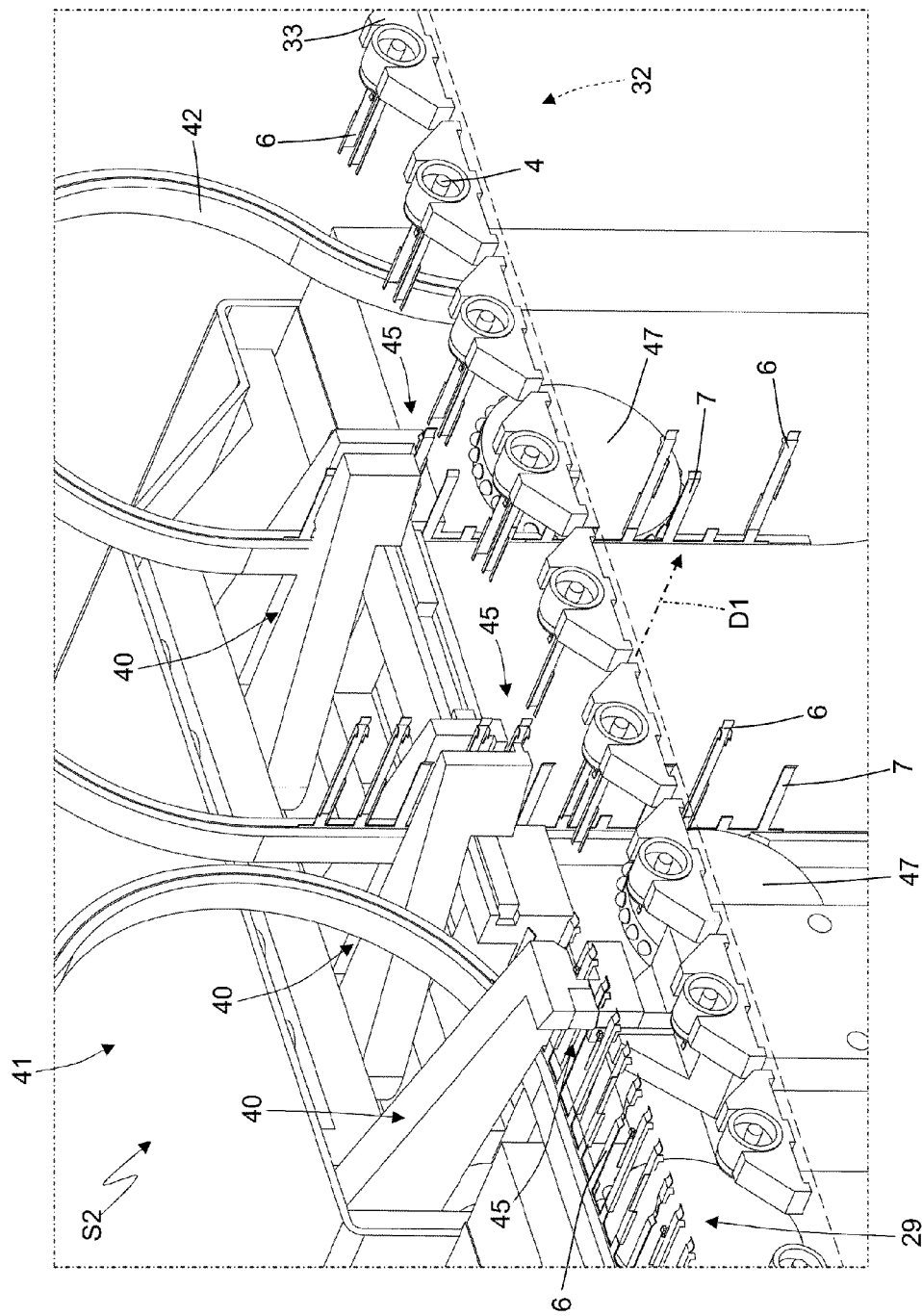
FIG. 14 is a view in enlarged scale of a detail of FIG. 13.

As illustrated in FIGS. 13 and 14, the application station S2 for applying the electrodes 6 and 7 is arranged along the conveyor 32 (i.e. along the conveying path P1) and comprises three gripping devices 40, each of which is designed to grip a corresponding electrode 6 or 7, and an actuating device 41, which cyclically moves each gripping device 40 back and forth along a fitting direction D1 perpendicular to the conveying path P1 so as to carry the electrode 6 or 7, gripped by the gripping device 40, to be connected to the corresponding supporting base 4 (i.e. to be inserted inside a corresponding electrical connection hole of the supporting base 4) during a forward stroke and detach the gripping device 40 from the electrode 6 or 7 connected to the supporting base 4 during a return stroke. According to a preferred embodiment illustrated in the attached figures, each gripping device 40 comprises a gripper consisting of two opposed and jointly hinged jaws.

In other words, each gripping device 40 grips, with methods described below, a corresponding electrode 6 or 7, then the actuating device 41 performs a forward stroke to carry the electrode 6 or 7, gripped by the gripping device 40, to be connected to the corresponding supporting base 4 (i.e. to be inserted inside a corresponding electrical connection hole of the supporting base 4), once the electrode 6 or 7 gripped by the gripping device 40 is connected to the corresponding supporting base 4 the gripping device 40 releases the electrode 6 or 7, and finally the actuating device 41 performs a return stroke to detach the gripping device 40 from the electrode 6 or 7 connected to the corresponding supporting base 4. According to a preferred embodiment, the actuating device 41 is one only one and common to all three gripping devices 40; in particular, the actuating device 41 comprises a slider that is slidably mounted along the fitting direction D1, with all three gripping devices 40 fitted one beside the other, and is connected to an actuator which imparts the reciprocating movement.

The application station S2 for applying the electrodes 6 and 7 receives a sheet metal strip 29 by a corresponding feed device 28; to feed the strip metal sheet 29 through the application station S2 for applying the electrodes 6 and 7 a fixed guide 42 is provided, inside which an edge 43 of the sheet metal strip 29 runs; in other words, the fixed guide 42 comprises an inner cavity in which the edge 43 of the sheet metal strip 29 runs and which has a lateral slot through which the rest of the sheet metal strip 29 protrudes from the fixed guide 42 projecting cantilevered from the fixed guide 42 itself.

Figure 5:
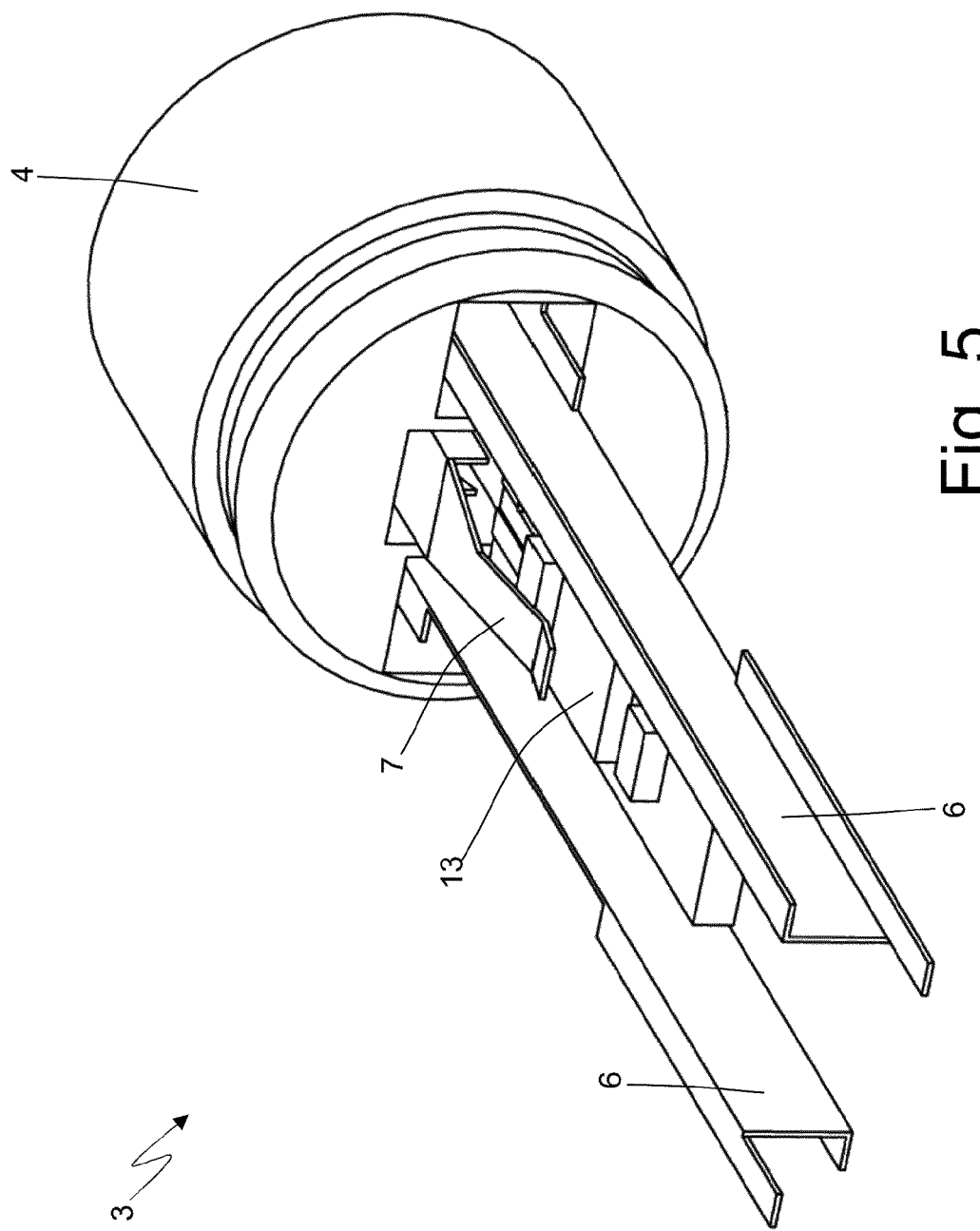

Upstream from the fixed guide 42 (and therefore upstream from the gripping devices 40) a working tool 44 is arranged which cyclically performs a blanking of the sheet metal strip 29 to form the electrodes 6 and 7 in the sheet metal strip 29 leaving a part of each electrode 6 or 7 in contact with the remaining part of the sheet metal strip 29 (i.e. in contact with the edge 43 of the sheet metal strip 29). In other words, the working tool 44 cyclically performs a cold working of the sheet metal strip 29 which consists in separating a defined flat geometry using a punch and a matrix suitably designed and inserted inside a more complex structure known as mold. According to a preferred embodiment, the punch and the matrix of the working tool 44 are shaped to also perform a shaping of the sheet metal strip 29 so that parts of each electrode 6 or 7 are folded (as illustrated in detail in FIG. 5); in other words, the working tool 44 also performs a folding of some parts of each electrode 6 or 7 to confer to the electrode 6 or 7 itself a desired shape (as illustrated in detail in FIG. 5).

Downstream from the gripping devices, what remains of the sheet metal strip 29 (i.e. the edge 43 and the protrusions from which the electrodes 6 and 7 were previously extending) is processed in a grinding device to be comminuted, and then subsequently collected and removed (and totally recycled).

To each gripping device 40 a corresponding cutting device 45 is associated, which cooperates with the gripping device 40 to separate the electrode 6 or 7 from the rest of the sheet metal strip 29 when the gripping device 40 grips the electrode 6 or 7 itself. In other words, each gripping device 40 grips an electrode 6 or 7 while the electrode 6 or 7 is still in one piece with the sheet metal strip 29 and contextually to said gripping (or immediately after said gripping) the corresponding cutting device 45 performs a cut to separate the electrode 6 or 7 gripped by the gripping device 40 from the rest of the sheet metal strip 29. According to a preferred (but not binding) embodiment, each cutting device 45 is separate from and independent of the corresponding gripping device 40 to separate the electrode 6 or 7 from the rest of the sheet metal strip 29 only after the gripping device 40 grips the electrode 6 or 7 itself; in this way an optimal grip (i.e. with a very precise positioning) of the electrode 6 or 7 from the corresponding gripping device 40 is always ensured.

According to a preferred embodiment, the working tool 44 blanking the sheet metal strip 29 obtains on the edge 43 of the sheet metal strip 29 a succession of through guide holes (illustrated schematically in FIG. 13); in this regard it should be observed that the sheet metal strip 29 is initially completely smooth (i.e. devoid of any incisions) and the guide holes 46 and the electrodes 6 and 7 are completely formed from scratch by the working tool 44. According to a possible embodiment illustrated in FIG. 13, when the working tool 44 forms the guide holes 46 in the edge 43 of the sheet metal strip 29, it also forms small through cuts 46a which are arranged transversely and have the function of increasing the flexibility of the sheet metal strip 29 so as to facilitate the subsequent manipulation thereof (especially with respect to the correct centering of the electrodes 6 and 7 fitted to the sheet metal strip 29 with respect to the corresponding supporting bases 4); as illustrated in FIG. 13, the small through cuts 46a are aligned with the guide holes 46 and arrive up to the guide holes 46 themselves, but alternatively the small through cuts 46a (or at least part of them) may not be aligned with the guide holes 46 and/or may not arrive up to the guide holes 46 themselves.

The feed device 28 comprises two sprocket wheels 47, which are arranged downstream from the working tool 44 at the gripping devices 40 and guide the feeding of the sheet metal strip 29 by engaging their sprockets in the through guide holes 46 of the sheet metal strip 29 itself. The function of the sprocket wheel 47 is to ensure a perfect synchronization of space between the electrodes 6 and 7, formed in the sheet metal strip 29, and the gripping devices 40, then preferably the sprocket wheels 47 are arranged near the gripping devices 40. According to a preferred embodiment illustrated in the attached figures, the through guide holes 46 formed in the edge 43 of the sheet metal strip 29 are circular and the sprockets of the sprocket wheels 47 have a hemispherical shape; in this way, the sprockets of the sprocket wheels 47 are "self-centering" inside the through guide holes 46 formed in the edge 43 of the sheet metal strip 29.

According to a preferred embodiment illustrated in the attached figures and clearly visible in FIGS. 9 and 10, two application stations S2 are provided for applying the electrodes 6 and 7 which are twins, redundant, and independent and are arranged one after the other along the conveying path P1; each application station S2 comprises its own gripping devices 40 (and therefore its own corresponding cutting devices 45), its own actuating device 41, its own feed device 28, and its own working tool 44. Consequently, the two application stations S2 are twins and completely autonomous one with respect to the other. Normally only one application station S2 and only one feed device 28 at a time is used while the other application station S2 and the other feed device 26 are stationary and therefore can be maintained even when the manufacturing machine 15 is functioning; furthermore, in the stationary feed device 28 (i.e. not in use) it is possible to perform the changing of the coil of the sheet metal strip 29. Alternatively, the two application stations S2 may be used together and in an alternative manner (that is, an insertion is performed by a feed station S2 while the subsequent insertion is performed by the other feed station S2) to halve the effective operating speed thereof.

The application station S2 for applying the electrodes 6 and 7 is particularly effective and efficient, as by withdrawing the electrodes 6 and 7 directly from the sheet metal strip 29 in which the electrodes 6 and 7 were formed in line (i.e. thanks to the blanking action of the working tool 44) it is possible to operate quickly (i.e. with a very high hourly productivity) while ensuring, at the same time, both a high precision in positioning the electrodes 6 and 7 and a very gentle treatment of the electrodes 6 and 7 which completely preserves the integrity of the electrodes 6 and 7 themselves (therefore ensuring an excellent overall production quality).

Particularly useful in this respect is the presence of the guide holes 46 that, by being formed simultaneously with the electrodes 6 and 7, allow to spatially synchronize in a very precise manner the position of the gripping devices 40 with the position of the electrodes 6 and 7.

Figure 15:
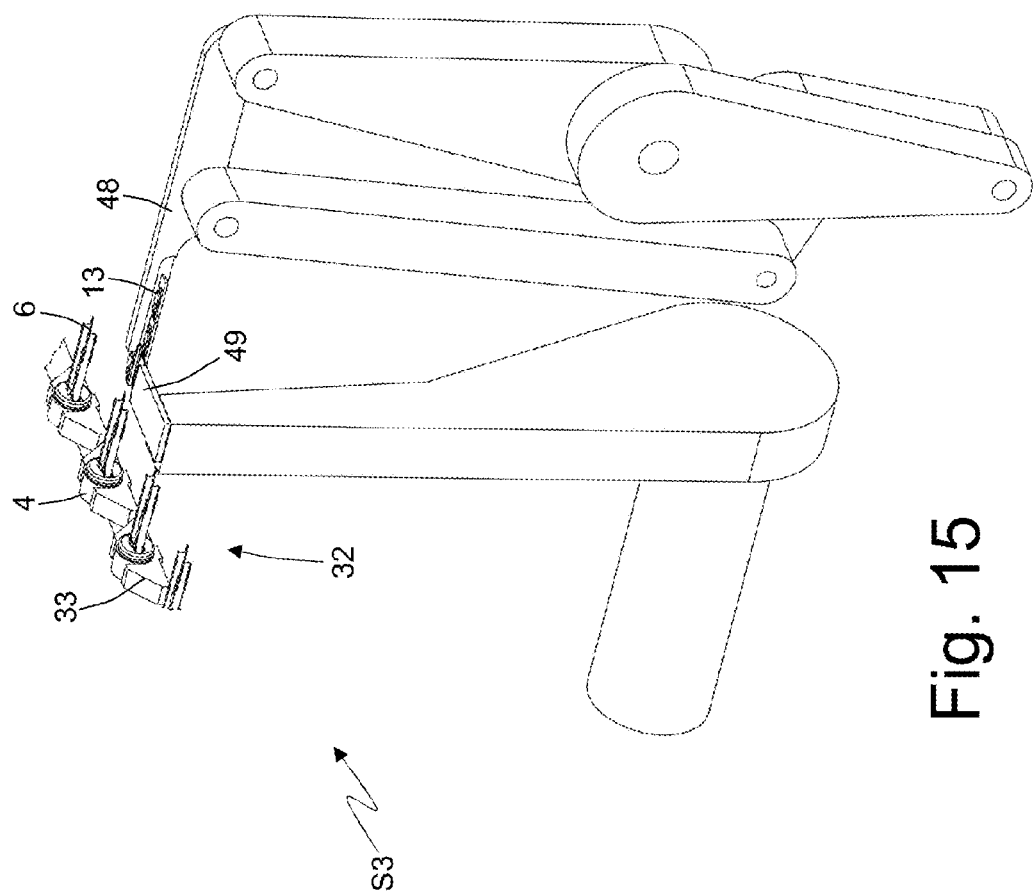
FIG. 15 is a perspective and schematic view an application station for applying the electronic circuits of the section assembly of FIG. 9.

As illustrated in FIG. 15, the application station S3 for applying the electronic circuits 13 comprises an insertion device 48 which pushes axially an electronic circuit 13 towards a corresponding supporting base 4 fitted to a pocket 33 of the conveyor 32; in the supporting base 4 the electronic circuit 13 rests on horizontal brackets that protrude cantilevered from the power electrodes 6 and is electrically connected to the signal electrode 7. A transfer device 49 is provided which receives the electronic circuits 13 from a corresponding feed device 24, and then pushes the electronic circuits 13 transversely so as to arrange in succession the electronic circuits 13 in front of the insertion device 48 which in turn pushes the same axially towards the respective supporting bases 4. The transfer device 49 comprises a pusher which is cyclically moved back and forth by means of a single rotation (i.e. with a single degree of freedom). Instead, the insertion device 48 comprises a pusher which is cyclically moved back and forth by means of a roto-translation obtained by means of an articulated quadrilateral element (i.e. with two degrees of freedom).

According to a preferred embodiment illustrated in the attached figures and clearly visible in FIGS. 9 and 10, two application stations S3 for applying the electronic circuits 13 are provided, which are twins, redundant, and independent and are arranged one after the other along the conveying path P1. The two application stations S3 are twins and completely autonomous one with respect to the other. Normally only one application station S3 and only one feed device 24 at a time are used, while the other application station S3 and the other feed device 24 are stationary and therefore can be maintained even when the manufacturing machine 15 is operating; alternatively, the two application stations S3 could be used alternately (that is, an insertion is performed from a feed station S3 while the subsequent insertion is performed by the other feed station S3) to halve the effective operating speed thereof.

The application station S4 for applying the supporting bodies (not illustrated in detail) is quite similar to the application station S3 for applying the electronic circuits 13 and comprises an insertion device (similar to the insertion device 48 of the application station S3) that pushes axially a supporting body 12 towards a corresponding supporting base 4 fitted to a pocket 33 of the conveyor 32, and a transfer device 49 (similar to the transfer device 49 of the application station S3), which receives the supporting bodies 12 from a corresponding feed device 26 and thus pushes the supporting bodies 12 transversely so as to arrange in succession the supporting bodies 12 in front of the insertion device which in turn pushes them axially towards the corresponding supporting bases 4.

According to a preferred embodiment illustrated in the attached figures and clearly visible in FIGS. 9 and 10, two application stations S4 for applying the supporting bodies 12 are provided which are twins, redundant, and independent and are arranged one after the other along the conveying path P1. The two application stations S4 are twins and completely autonomous one with respect to the other. Normally only one application station S4 and only one feed device 26 at a time are used while the other application station S4 and the other feed device 26 are stationary and therefore can be maintained even when the manufacturing machine 15 is operating; alternatively, the two application stations S4 may be used together and in an alternative manner (that is, an insertion is performed from a feed station S4 while the subsequent insertion is performed by the other feed station S4) to halve the effective operating speed thereof.

Figure 16:
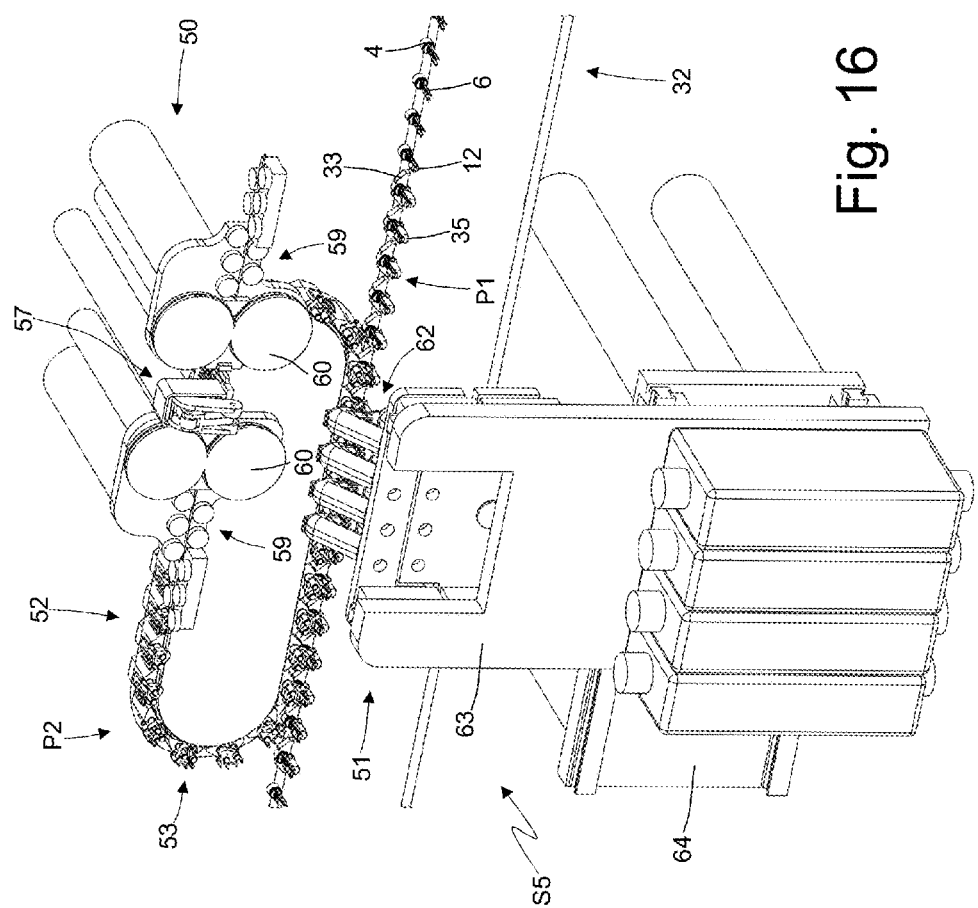
FIGS. 16 and 17 are two different perspective and schematic views of an application station for applying heating members of the assembly section of FIG. 9.
Figure 17:
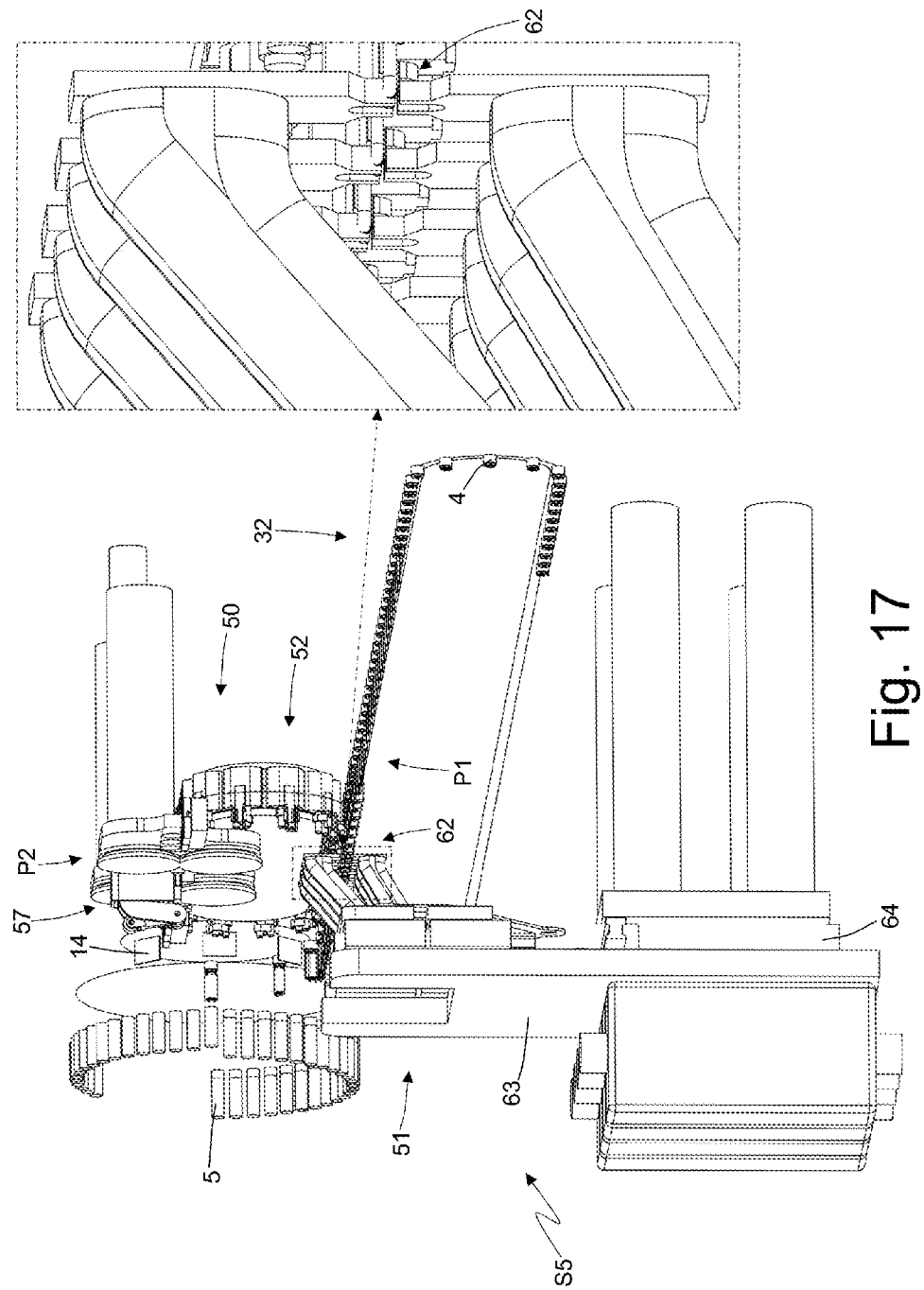
Figure 18:
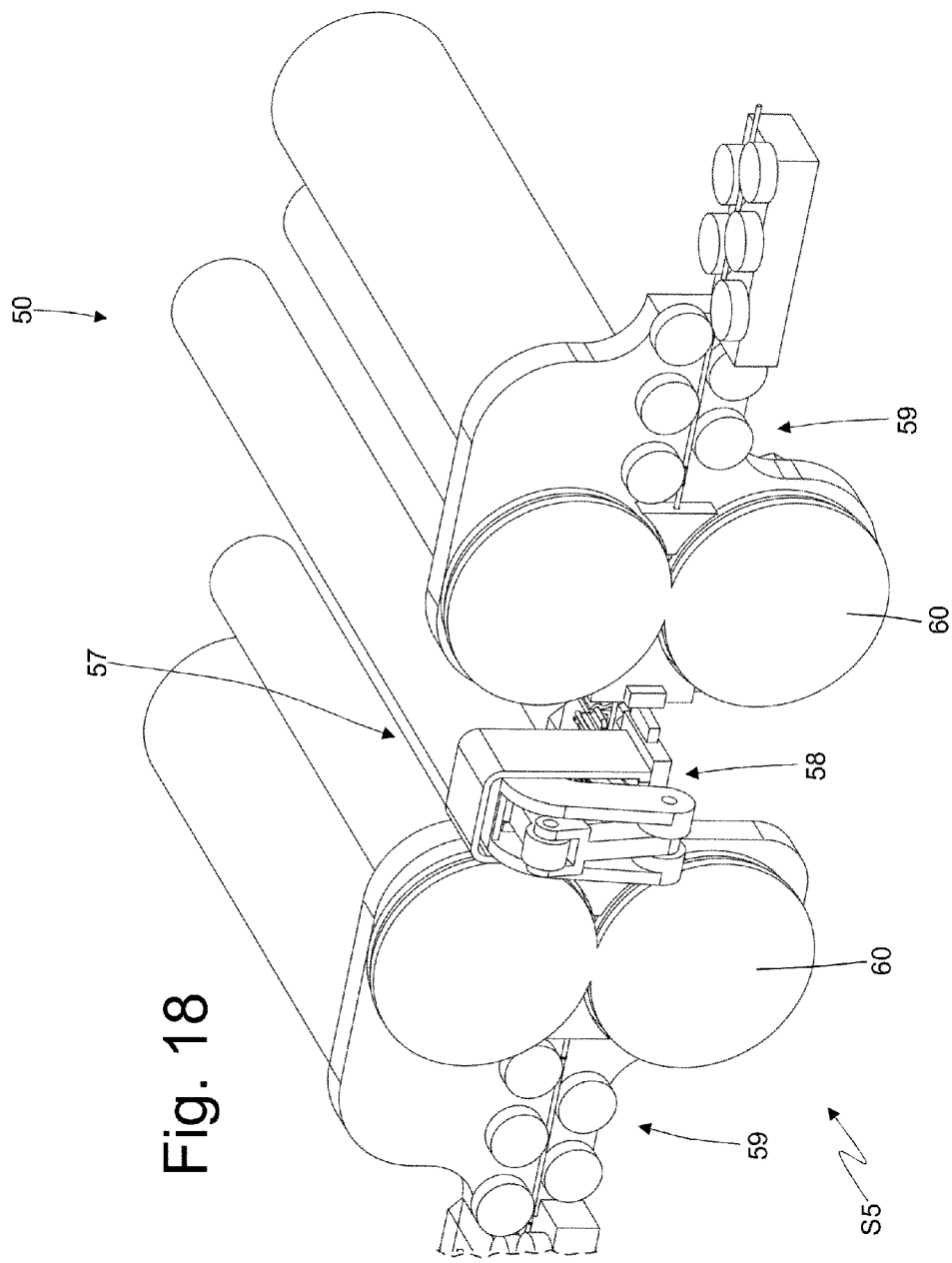
FIG. 18 is a perspective and schematic view of a detail of the application station for applying heating members of FIGS. 16 and 17.

As illustrated in FIGS. 16, 17 and 18, the application station S5 for applying the heating members 8 comprises a connecting unit 50, which connects a heating member 8 to the power electrodes 6 of each supporting base 4 while the supporting base 4 is housed in a corresponding pocket 33 of the conveyor 32. In addition, the application station S5 for applying the heating member 8 comprises a welding device 51, located along the conveyor 32 to form in each supporting base 4 a weld between the two terminals 11 of the heat resistor 10 of the heating member 8 and the corresponding power electrodes 6.

The connecting unit 50 comprises a feed conveyor 52 located above the conveyor 32 and comprises a number of grippers 53 which are fed along a U-shaped feed path P2 for a certain distance running parallel to and facing towards the conveying path P1. As more clearly illustrated in FIGS. 19 and 20, each gripper 53 comprises two opposed jaws 54 which are movable between an open position (illustrated in part of FIG. 20) in which the two jaws 54 are relatively distant from each other and a closed position (illustrated in FIG. 19 and in part of FIG. 20), in which the two jaws 54 are relatively close together to tighten the U-folded heating member 8. Furthermore, as better illustrated in FIGS. 19 and 20, each gripper 53 comprises a fixed central support 55, which is U-shaped and located between the two jaws 54 to provide a gripping contrast to the two jaws 54 themselves so that each branch of the U-folded heating member 8 is gripped between a jaw 54 and a corresponding wall of the central support 55. Preferably, in each gripper 53 the jaws 54 are hinged to the gripper 53 itself and the rotation movement of the jaws 54 is imparted by means of a cam actuated system.

According to a preferred embodiment, each gripper 53 is hinged to the feed conveyor 52 to rotate with respect to the feed conveyor 52 about a rotation axis 56 perpendicular to the feed path P2; the rotation of each gripper 53 with respect to the feed conveyor 52 and about the rotation axis 56 is controlled by a cam actuated system. Each gripper 53 rotates with respect to the feed conveyor 52 at the area in which the gripper 53 is connected from above with a corresponding pocket 33 on the conveyor 32 to rest a U-folded heating member 8 on the power electrodes 6 of a supporting base 4 fitted in the pocket 33; furthermore, each gripper 53 rotates with respect to the feed conveyor 52 at the area in which the gripper 53 separates detaching upwardly from a corresponding pocket 33 of the conveyor 32. The rotation function of each gripper 53 with respect to the feed conveyor 52 is to enable the gripper 53, from above, to fit into a corresponding pocket 33 of the conveyor 32 and to separate upward from the pocket 33 of the conveyor 32 without mechanical interference and without subjecting the heating member 8 and/or the power electrodes 6 to undesired mechanical stress.

As more clearly illustrated in FIG. 18, the connecting unit cooperates with (comprises) a folding device 57 located over the feed conveyor 52, receives the straight heating members 8 (i.e. devoid of folds) from the feed device 30 and inserts each heating member 8 in a corresponding gripper 53 of the feed conveyor 52 by simultaneously folding into a 'U' the heating member 8. In other words, in the insertion movement of each heating member 8 in a corresponding gripper 53 of the feed conveyor 52, the heating member 8 itself is folded into a 'U' thus assuming the final folded configuration; it is therefore evident that the heating members 8 are folded into a 'U' (widely) before connecting each heating member 8 to the power electrodes 6 of the corresponding supporting base 4. According to a preferred embodiment, the folding device 57 comprises a pusher 58, which pushes each heating member 8 perpendicularly to the feed path P2 to insert the heating member 8 in a corresponding gripper 53 and, at the same time, folding the heating member 8 into a 'U'.

The connecting unit 50 comprises twin redundant manipulating devices 59 located on opposite sides of the folding device 57 and each of which is designed to feed a succession of straight heating members 8 (that is, without folds) towards the folding device 57 itself. Each manipulating device 59 receives a string of heating members 8 from the feed device 30 (in particular from one of the two coils fitted to the feed device 30) and comprises a cutter 60 for cutting transversely the string and then separate the heating member 8 from the string. According to a preferred embodiment, each manipulating device comprises a succession of opposed rollers (oriented both horizontally and vertically) that are arranged upstream from the cutter 60 and have the function to "straighten" the string to eliminate, at least in part, the curvature imposed by the previous coil winding. Once separated from the string, each straight heating member 8 is pushed by the pusher 58 of the folding device 57 towards a gripper 53 of the feed conveyor 52 to fold into a 'U' when entering the gripper 53 itself. Normally only one manipulating device 59 is used while the other manipulating device 59 is stationary, and then can be maintained even when the manufacturing machine 15 is operating; furthermore a safely change of the coil connected to the stationary manipulating device 59 can be performed.

Figure 19:
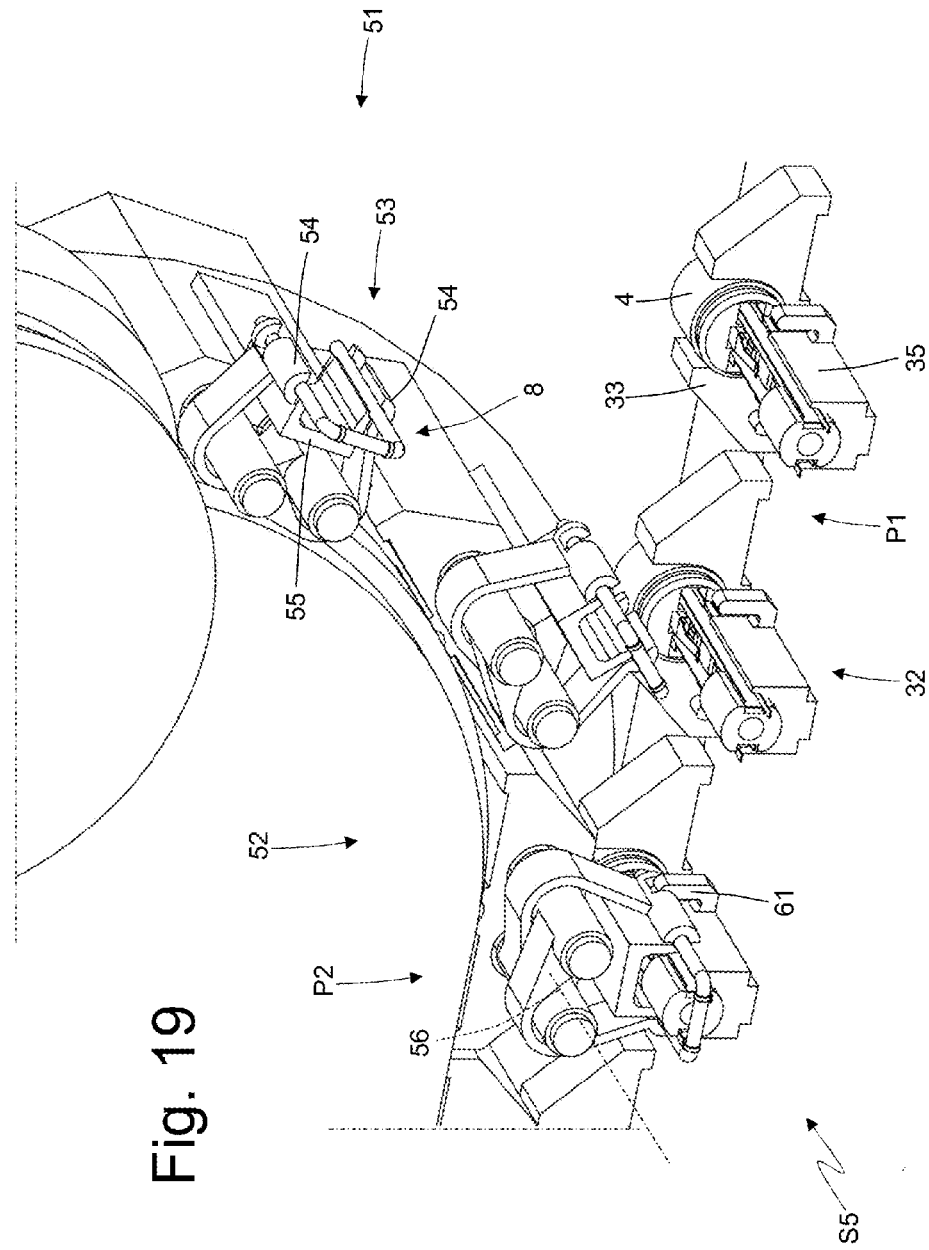
FIGS. 19 and 20 are two views in enlarged scale of two different details of the application station for applying heating members of FIGS. 16 and 17.
Figure 20:
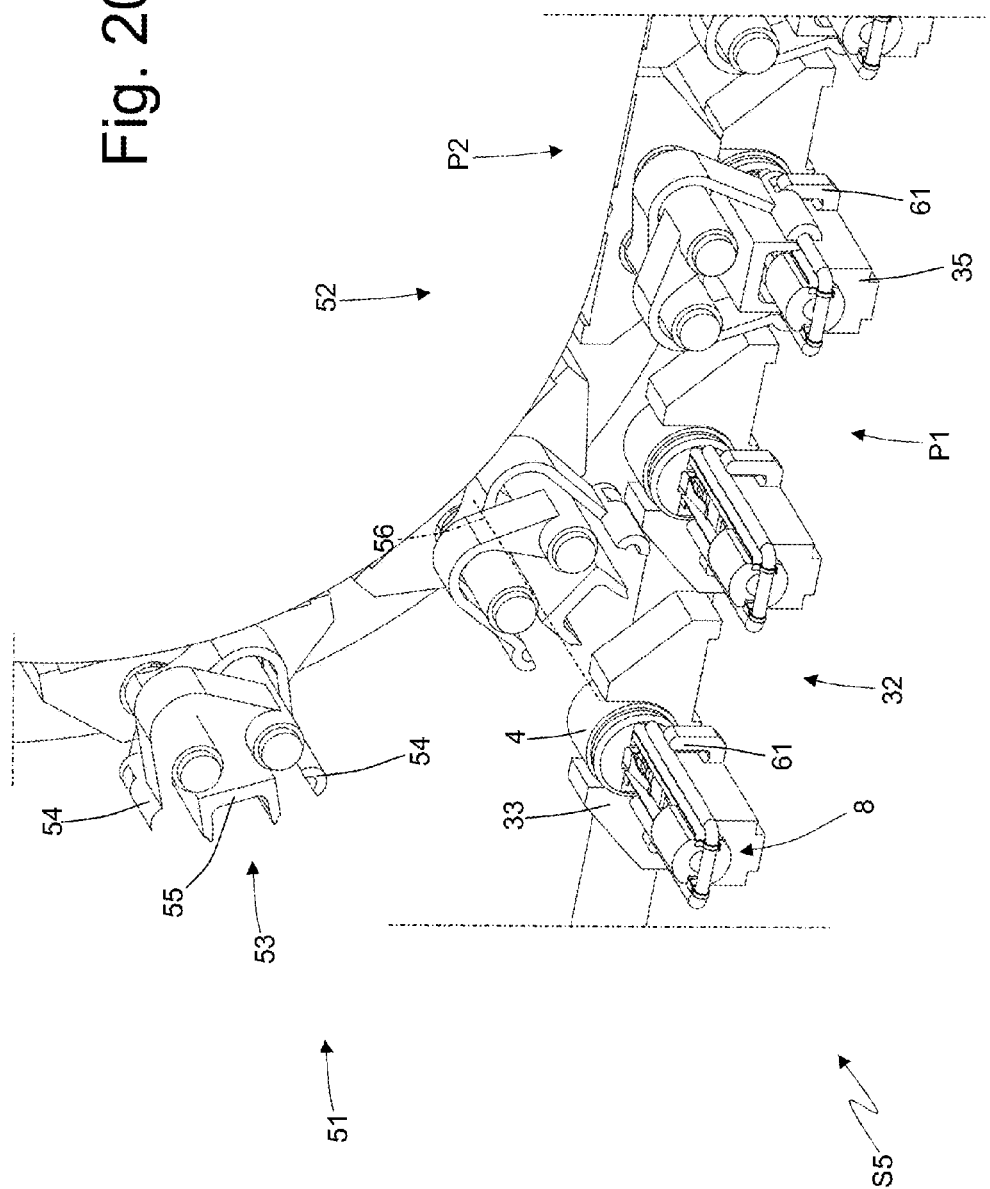

According to a preferred embodiment illustrated in the attached figures and clearly visible in FIGS. 19 and 20, each pocket 33 of the conveyor 32 comprises a pair of abutment elements 61 which are arranged on opposite sides of the pocket 33, and rest on the heating member 8 to keep folded into a 'U' the heating member 8. In other words, the two abutment elements 61 of each pocket 33 of the conveyor 32 lock the heating member 8 in the 'U' shape preventing any desired type of elastic return of the heating member 8 itself.

As illustrated in FIGS. 16 and 17, the welding device 51 comprises a series of four welding guns 62, each of which comprising two opposed jaws engaging from two opposite sides the heating member 8 and are vertically movable to engage and disengage the heating member 8 itself. Preferably, the welding device 51 is mounted to move parallel to the conveying path P1 and moves back and forth along the conveying path P1 itself so as to accompany the pockets 33 with which it cooperates along a portion of conveying path P1 (corresponding to four feed steps). In particular, the four welding guns 62 are fitted to a common support 63, which is mounted to slide along a fixed rail 64 oriented parallel to the conveying path P1; in this way, the four welding guns 62 can move parallel to the conveying path P1 with a cyclical back and forth movement to accompany the corresponding pockets 33 of the conveyor 32 along a portion of the conveying path P1.

In other words, the welding device 51 engages the heating members 8 of four adjacent pockets 33 (with the four corresponding welding guns 62) and follows the movement of the four adjacent pockets 33 for a certain portion of the conveying path P1 by moving along the conveying path P1 itself in a synchronized manner with the four adjacent pockets 33; once the welding of the terminals 11 of the heating members 8 is completed, the welding device 51 disengages the heating members 8 and quickly returns to an initial position to start a new welding cycle with other four adjacent pockets 33. In this way, each welding gun 62 has a relatively long time available to complete the welding of the terminals 11 of the corresponding heating member 8.

The application station S5 for applying the heating members 8 is particularly effective and efficient, as by folding into a 'U' each heating member 8 before connecting the heating member 8 to the power electrodes 6 and especially before welding the terminals 11 of the heating member 8 itself to the corresponding power electrodes 6 it allows to considerably reduce the mechanical stress (and hence also unwanted deformation) to which the terminals 11, the power electrodes 6 and the welding between the terminals 11 and the power electrodes 6 are subjected. Consequently, it is possible to operate quickly (i.e. with a very high hourly productivity) while ensuring a good electrical connection (i.e. stable and durable and therefore not subject to accidental breakage) between the power electrodes 6 and the terminals 11 of each heating member 8.

Figure 21:
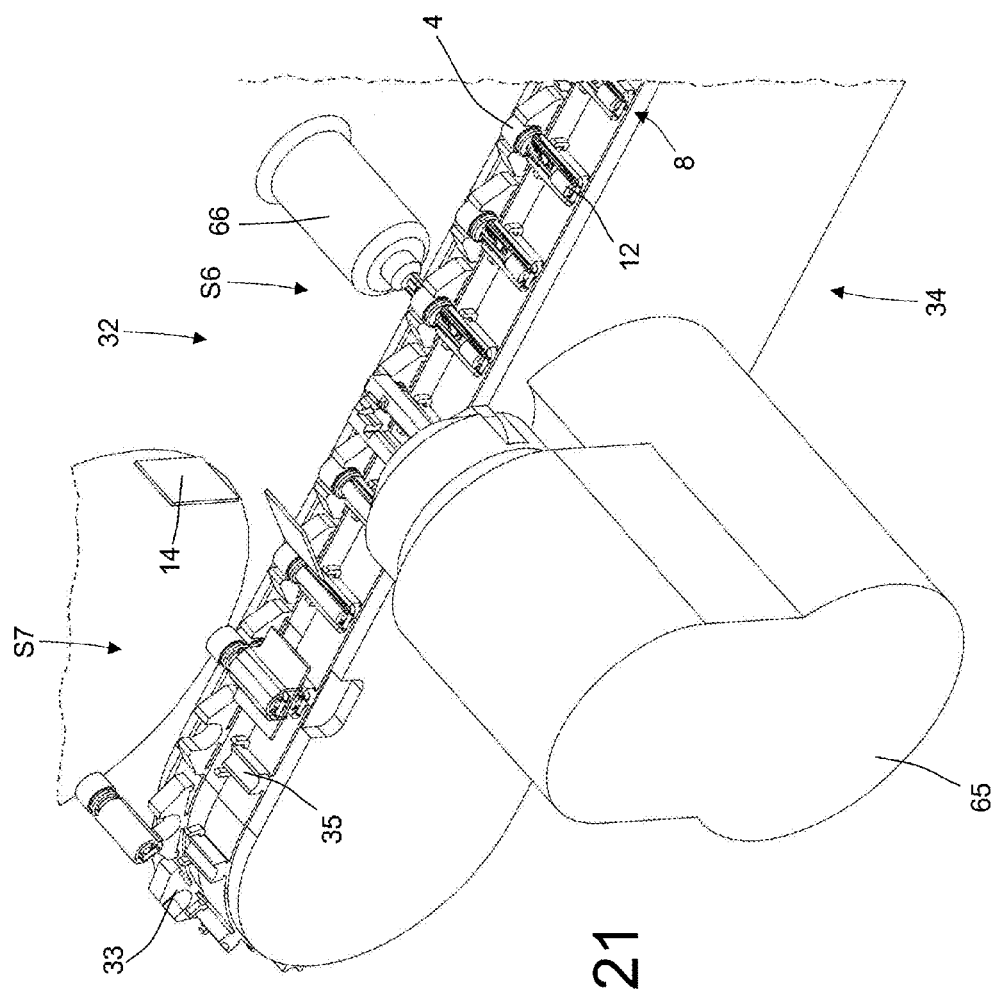
FIG. 21 is a perspective and schematic view of a rotation station of the assembly section of FIG. 9.

As illustrated in FIG. 21, the rotation station S6 comprises a rotation device 65, which engages each supporting base 4 fitted to a corresponding pocket 33 on the conveyor 32 (obviously the supporting base 4 is fitted with electrodes 6 and 7, electronic circuit 13, the supporting body 12 and the heating member 8 applied earlier), and it rotates by 180° the supporting base 4 (i.e. upside down). Said rotation of the four supporting bases 4 is not strictly required, but it allows to make the subsequent application of the hygroscopic pads 14 more effective (according to application modes described below); in particular, said rotation of the supporting bases 4 allows to expose the rear part of the corresponding supporting bodies 12 towards the top, which is smooth and substantially cylindrical and therefore provides a supporting base more secure and stable for the hygroscopic pads 14.

According to a preferred embodiment, between the application station S5 for applying the heating members 8 and the rotation station S6 a control device 66 is arranged, which performs controls of the electrical continuity to verify the correct functioning both of the heating members 8, and of the electronic circuits 13; in particular, the control device 66 comprises terminals that are inserted into corresponding electrical connection holes of each supporting base 4 and verify the correct operation both of the heating member 8, and of the electronic circuit 13. The control device 66 controls a discharge device, located downstream from the control device 66 and discharge the defective cartridge 2. In addition to the control device 66 arranged between the application station S5 for applying the heating members 8 and the rotation station S6, other control devices (generally of optical type) may be provided which control also the discharge device.

Figure 22:
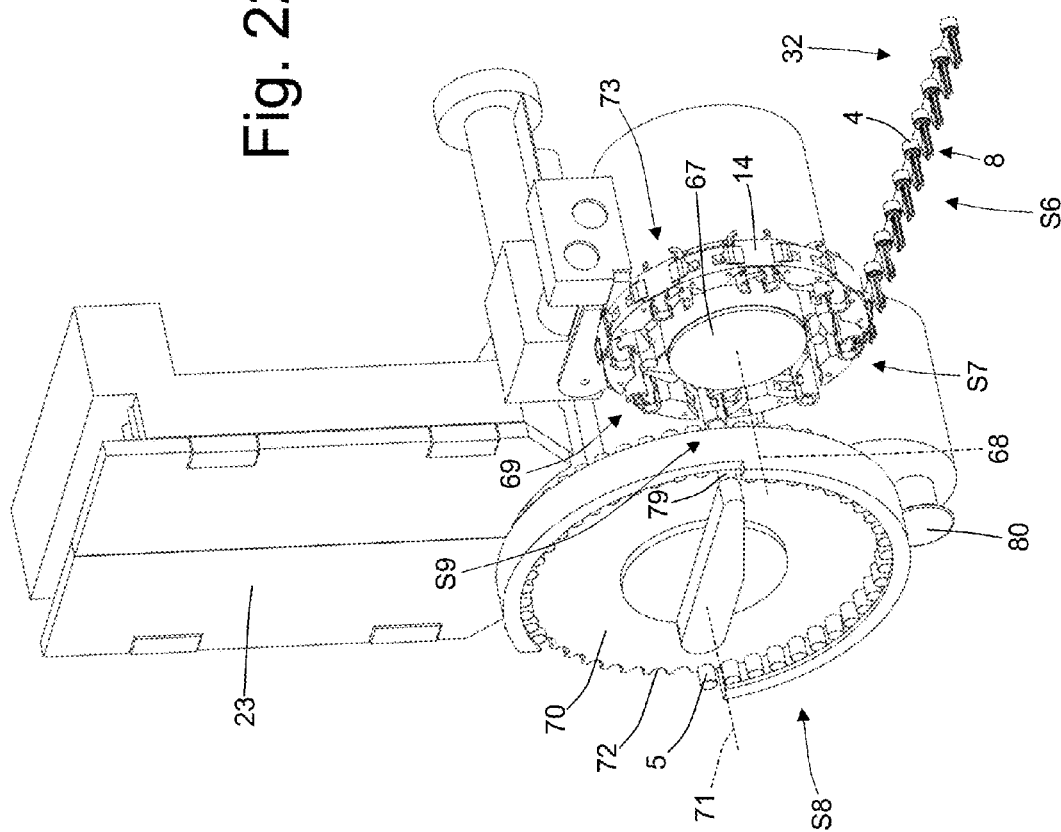
FIG. 22 is a perspective and schematic view of an application station for applying the hygroscopic pads and a subsequent application station for applying the bases of the assembly section of FIG. 9.
Figure 23:
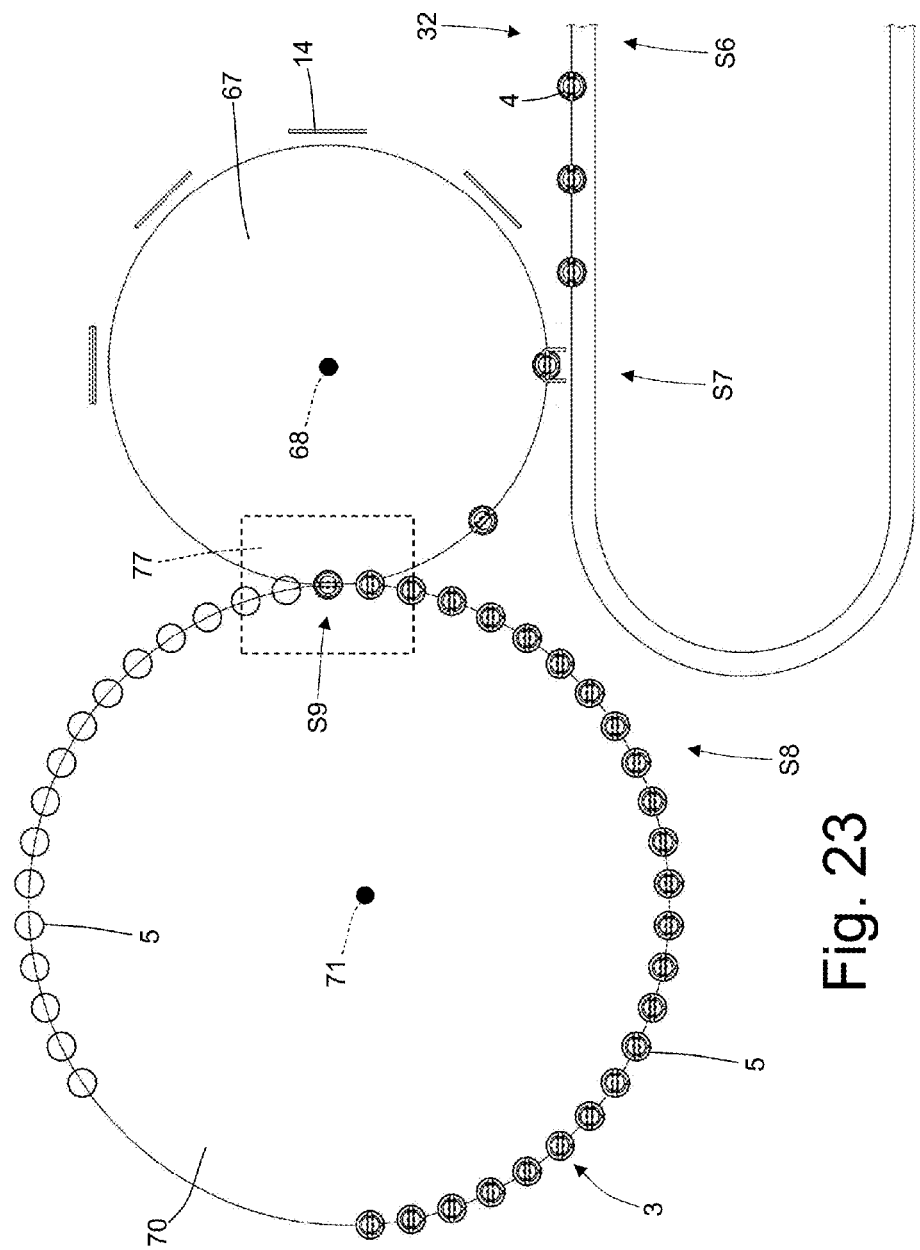
FIG. 23 is a schematic front view showing the feeding of the materials in the stations of FIG. 22.
Figure 24:
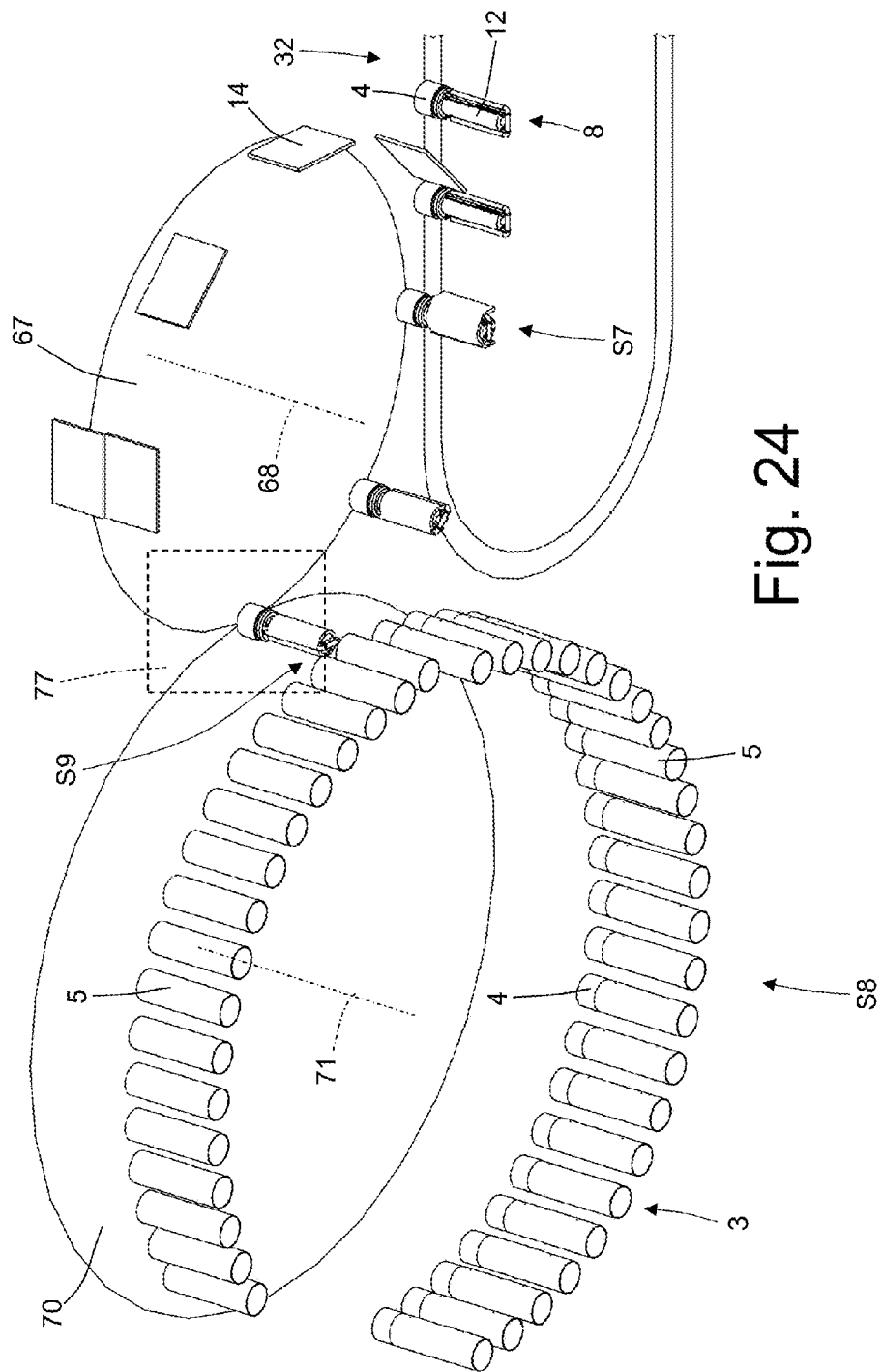
FIG. 24 is a schematic perspective view that shows the feeding of the materials in the stations of FIG. 22.

As illustrated in FIGS. 22, 23 and 24, the application station S7 for applying the hygroscopic pads 14 comprises a conveyor 67, which is shaped as a drum mounted for rotating about a central rotation axis 68 and supports a number of grippers 69, each of which is designed to contain a corresponding supporting base 4 (fitted with electrodes 6 and 7, electronic circuit 13, supporting body 12 and heating member 8 applied previously). The conveyor 67 is arranged above the conveyor 32, so that each supporting base 4 (fitted with electrodes 6 and 7, electronic circuit 13, supporting body 12 and heating member 8 applied previously) can be transferred with a vertical movement from the bottom to the top by a pocket 33 of the conveyor 32 to a gripper 69 of the conveyor 67.

As illustrated in FIGS. 22, 23 and 24, the application station S8 for applying the bases 5 comprises a conveyor 70, which is shaped as a drum mounted for rotating about a central rotation axis 71 and supports a number of seats 72, each of which is designed to contain a corresponding base 5. The conveyor 70 is arranged next to the conveyor 67 (the two rotation axes 68 and 71 are parallel to each other) and partly overlaps the conveyor 67 so that a supporting base 4 (fitted with electrodes 6 and 7, electronic circuit 13, supporting body 12, heating member 8 and hygroscopic pad 14 previously applied) can be moved axially (that is, with a movement parallel to the rotation axes 68 and 71) by a gripper 69 of the conveyor 67 to a seat 72 of the conveyor 70. A hopper 23 which receives the bases 5 from the feed device 21 for feeding the bases 5 is connected to the conveyor 70; lower outlet mouths of the hopper 23 are arranged at a periphery of the conveyor 70 and pushers are provided (for example ten side by side pushers) which have a reciprocating movement along a direction parallel to the rotation axis 71 of the conveyor 70 and push cyclically a number of bases 5 out of the lower outlet mouths of the hopper 23 up to the insertion in corresponding seats 72 of the conveyor 70.

Figure 25:
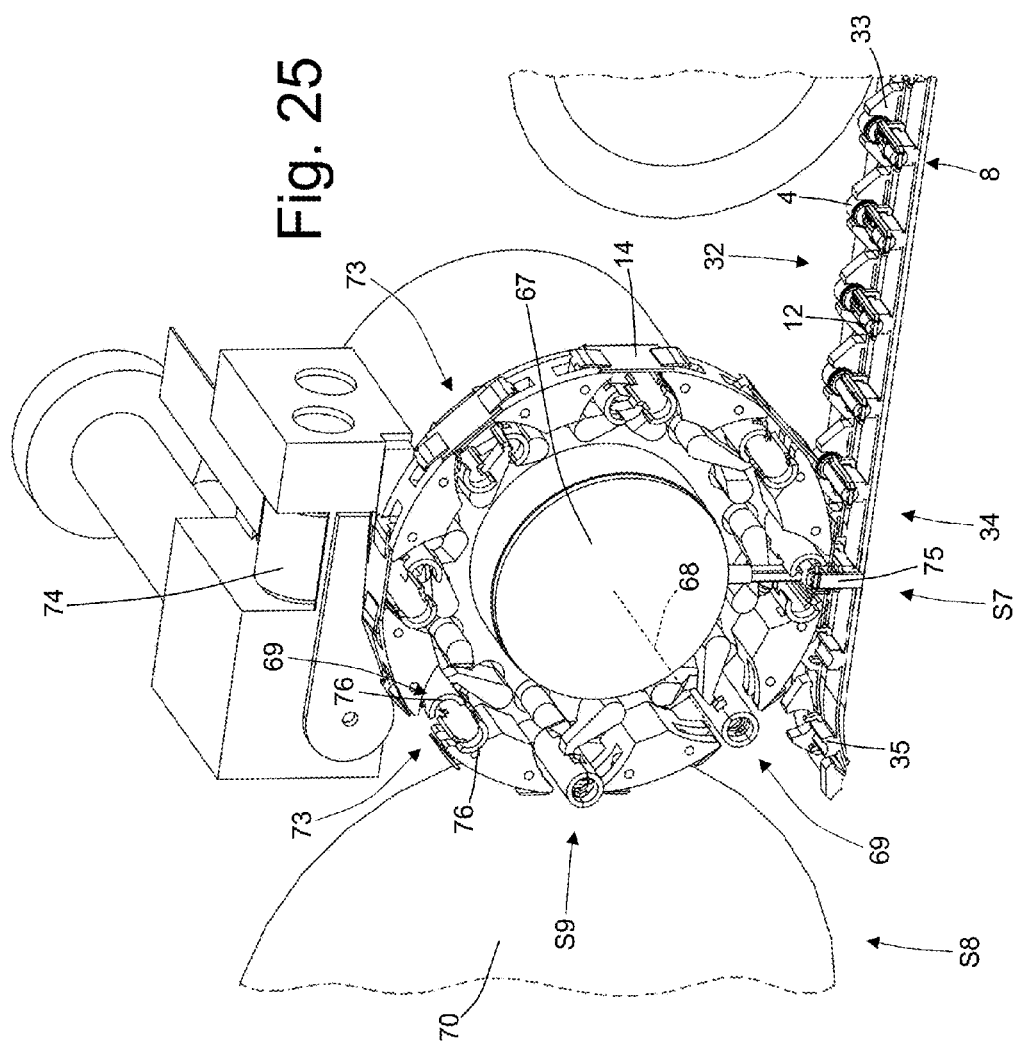
FIG. 25 is a schematic perspective of the application station for applying the hygroscopic pads.
Figure 26:
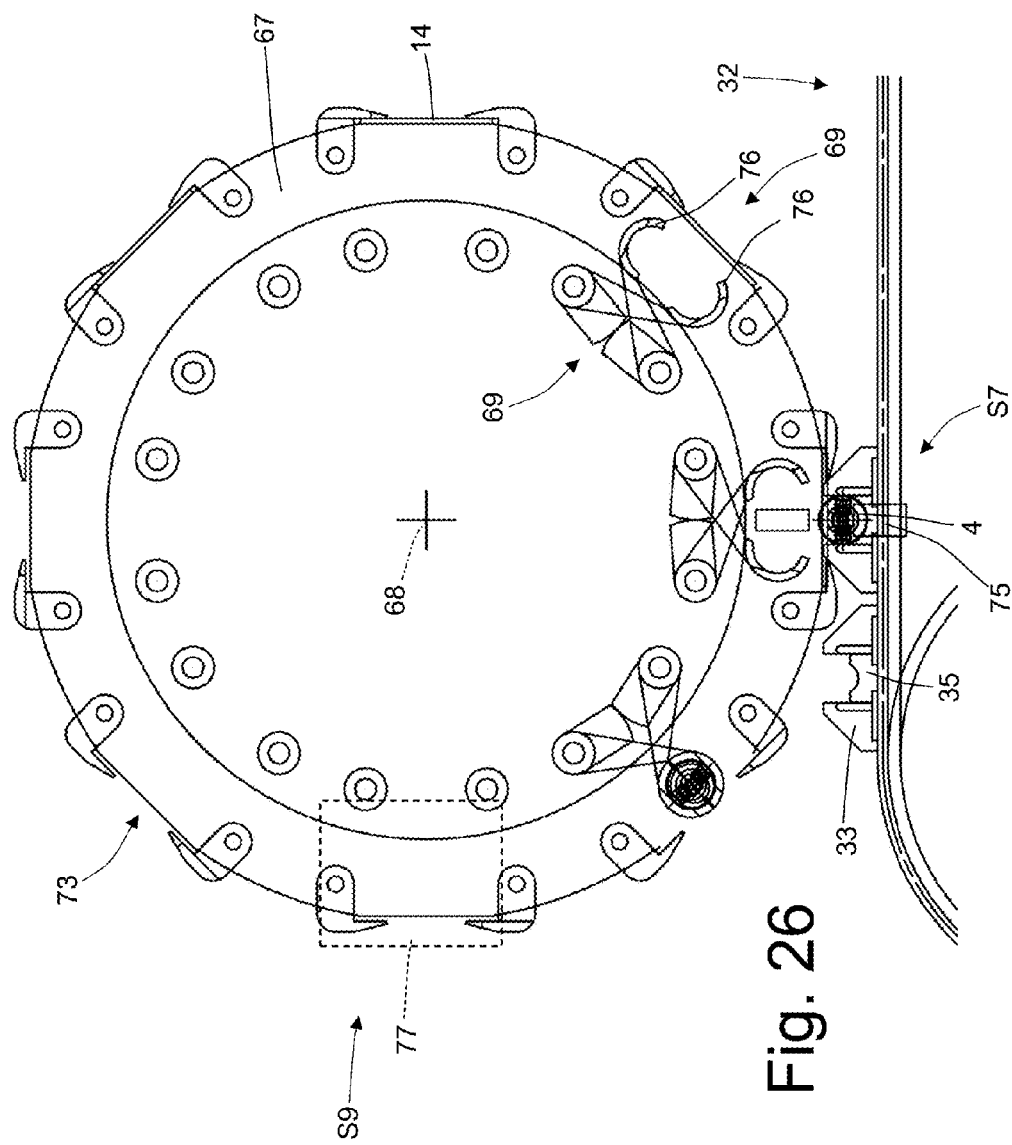
FIGS. 26, 27 and 28 are three schematic and front views of the application station for applying hygroscopic pads in three different operating intervals.
Figure 27:
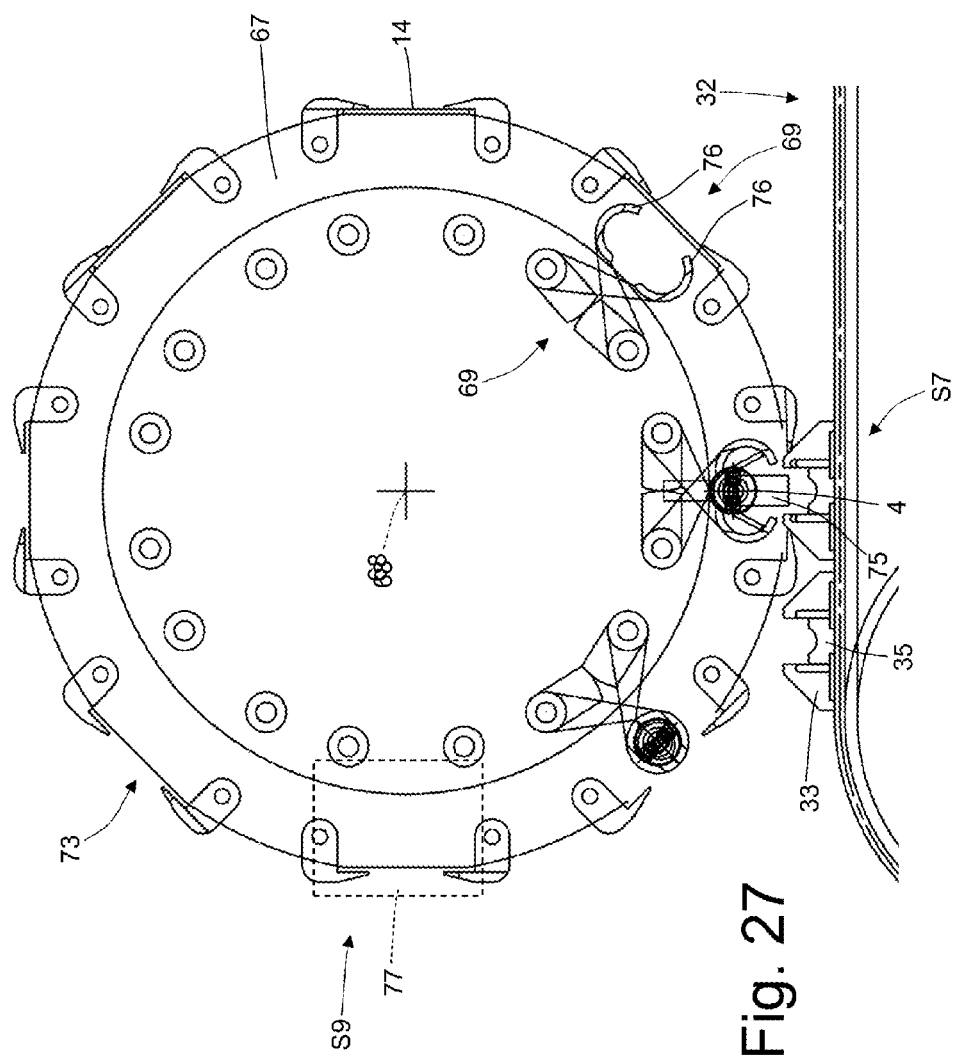
Figure 28:
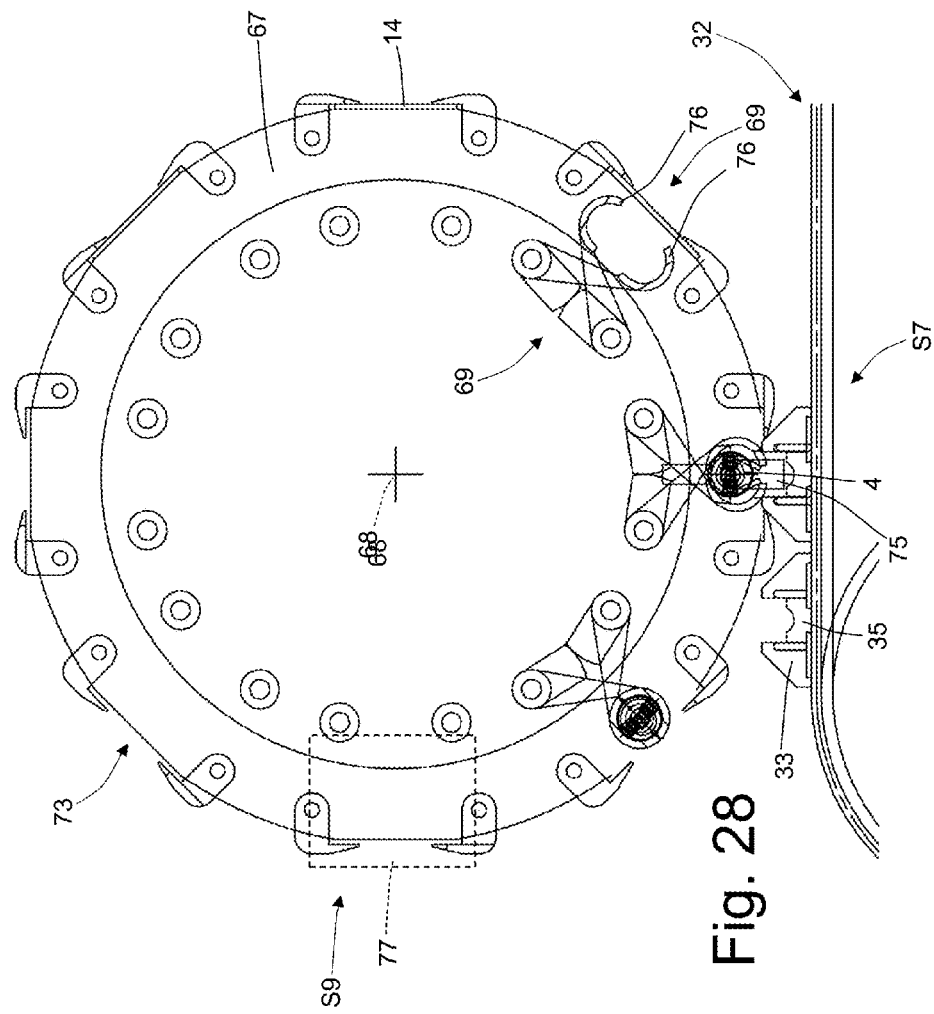

As more clearly illustrated in FIG. 25, to each gripper 69 of the conveyor 67 a pocket 73 is connected, which is arranged radially outermost with respect to the gripper 69 to receive and retain a corresponding hygroscopic pad 14 rectangular in shape and initially flat so that the hygroscopic pad 14 itself is arranged in front of the gripper 69. In the embodiment illustrated in the attached figures, each pocket 73 comprises two opposed hooks that are hinged to the conveyor 67 and retain a corresponding flat hygroscopic pad 14 against an outer surface of the conveyor 67 itself.

An insertion device 74 is provided, which is arranged at the upper periphery of the conveyor 67 and is designed to insert in succession the flat hygroscopic pads 14 in the corresponding pockets 73; the manipulating device 74 receives from the feed device 31 for feeding the hygroscopic pads 14 a continuous strip of hygroscopic material coming from a coil and cyclically performs a transverse cutting of the continuous strip of hygroscopic material to separate a succession of flat hygroscopic pads 14 that are inserted in corresponding pockets 73.

As illustrated in FIG. 25, the application station S7 for applying the hygroscopic pads 14 comprises an insertion device 75 for inserting each supporting base 4 (fitted with electrodes 6 and 7, electronic circuit 13, supporting body 12 and heating member 8 previously applied) from a pocket 33 of the conveyor 32 inside a corresponding gripper 69 of the conveyor 70 so as to intercept the hygroscopic pad 14 which is housed inside the corresponding pocket 73 and is folded into a 'U' around the heating member 8 entering the gripper 69.

As illustrated in FIGS. 25-28, each gripper 69 has a tubular shape and is formed by two shell elements 76 (of semicircular cross section), which are movable with respect to each other between an open position in which the two shells 76 are arranged at given distance from each other, and a closed position in which the two shells 76 are arranged in contact with each other. In particular, in each gripper 69 the two shell elements 76 are hinged to the conveyor 70 to move with respect to each other by means of corresponding rotations.

The shell elements 76 of each gripper 69 are set to the open position to allow a radial entrance of the supporting base 4 (fitted with electrodes 6 and 7, electronic circuit 13, supporting body 12 and the heating member 8 applied previously) connected to the hygroscopic pad 14 folded into a 'U' and are set to the closed position, after insertion, to fold the hygroscopic pad 14 into a tube around the heating member 8. In other words, in each gripper 69 the initially flat hygroscopic pad 14 is intercepted by the supporting base which moves vertically upwards, and then entering the gripper 69 (with the shell elements 76 arranged in the open position) 'U' folds around the supporting base 4; once the supporting base 4 is fully entered in the gripper 69, the shell elements 76 of the gripper 69 are brought into the closed position to fold the hygroscopic pad 14 into a tube around the heating member 8.

Figure 29:
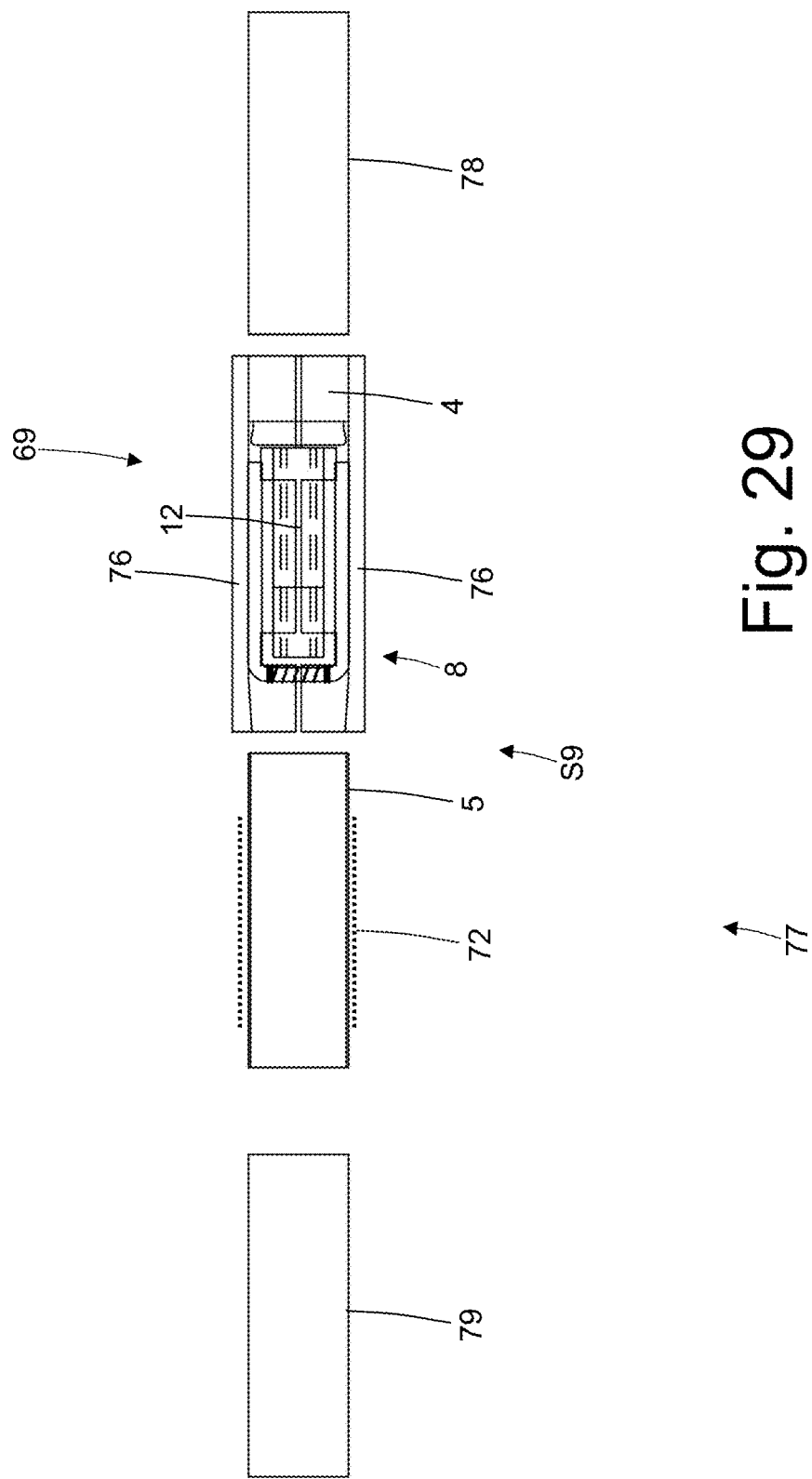
FIG. 29 is a schematic and horizontal section view of a transfer device between the application station for applying the hygroscopic pads and the application station for applying the bases.
Figure 30:
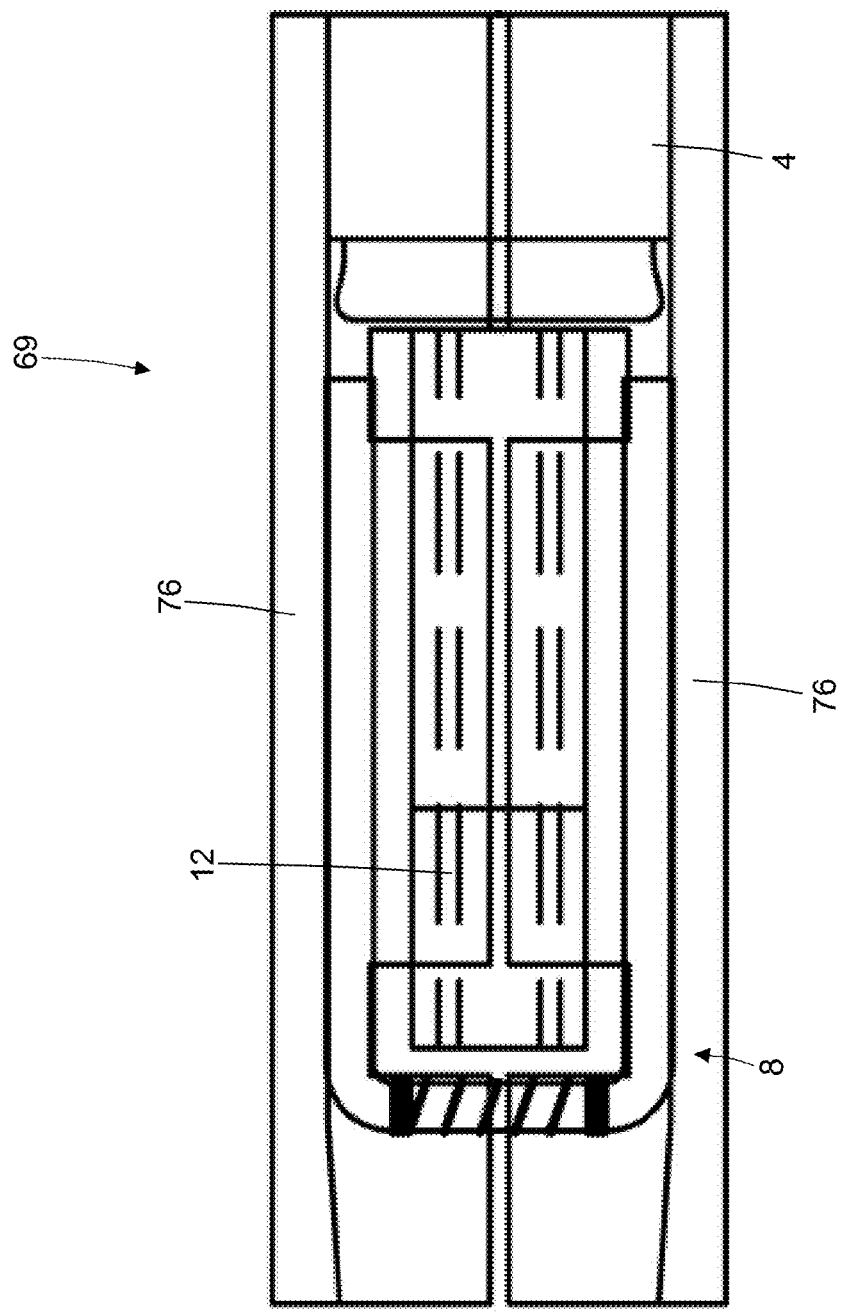
FIG. 30 is a view in enlarged scale of a detail of FIG. 29.

As illustrated in FIGS. 29 and 30, between the application station S7 for applying the hygroscopic pads 14 and the application station S8 for applying the bases 5 a transfer station S9 is defined in which a transfer device 77, which extracts the supporting base 4 (provided with, among other things, the heating member 8 and the tube-folded hygroscopic pad 14) axially from the gripper 69, when the shell elements 76 of the gripper 69 are still in the closed position.

In the transfer station S9, each seat 72 of the conveyor 70 is aligned axially with a corresponding gripper 69 of the conveyor 67 so that the supporting base 4 (provided with, among other things, the heating member 8 and the tube-folded hygroscopic pad 14) is extracted axially from the gripper 69 the conveyor 67 and inserted axially into the base 5 fitted in the seat 72 of the conveyor 70 by the action of the transfer device 77. According to a preferred embodiment, each gripper of the conveyor 67 has an inner flared shape which is progressively reduced at an output end through which the supporting base 4 protrudes from the gripper 69 itself. During the transfer of a supporting base 4 the corresponding gripper 69 of the conveyor 67 is kept in the fully closed position until the supporting base 4 reaches the proximity of the outlet end and is opened partly when the supporting base 4 arrives in proximity to the outlet end; in this way the flared shape of each gripper 69 is used to compress radially the tube-folded hygroscopic pad 14 (which has the ability to elastically deform without damage) so as to facilitate the entrance into the corresponding base 5, while the flared shape of each gripper 69 is not used at the entering time of the supporting base 4 into the base 5 since the supporting base 4 does not have the ability to elastically deform without damage.

According to the preferred embodiment illustrated in the attached figures, the transfer device 77 comprises a pusher 78 which passes through the gripper 69 of the conveyor 67 to push axially the supporting base 4 (provided with, among other things, the heating member 8 and the tube-folded hygroscopic pad 14), and a counter-pusher 79 opposite and aligned with the pusher 78 crosses the seat 72 of the conveyor 70 to accompany, on the opposite side with respect to the pusher 58, the axial movement of the supporting base (provided with, among other things, the heating member 8 and the tube-folded hygroscopic pad 14).

According to a possible embodiment, the transfer station S9 also comprises a rotation device, which is connected to each seat 72 of the conveyor 70 and is designed to cause the rotation of the corresponding base 5 in the transfer station S9 during the axial insertion of the supporting base 4 (provided with, among other things, the heating member 8 and the tube-folded hygroscopic pad 14); the rotation of the base 5 in the transfer station S9 allows to facilitate the axial insertion of the supporting base 4 (provided with, among other things, the heating member 8 and the tube-folded hygroscopic pad 14).

As illustrated in FIG. 22, the conveyor 70 is connected to a crimping (caulking) device 80 which is arranged downstream from the transfer station S9 and deforms one edge of the base 5 for mechanically constraining the supporting base 4 to the base 5 itself.

The application station S7 for applying the hygroscopic pads 14 is particularly effective and efficient, as starting from hygroscopic pads 14 that are initially folded into a 'U' when entering the opened corresponding grippers 69 and are subsequently folded into a tube by closing the grippers 69, it is possible to operate quickly (i.e. with a very high hourly productivity) while ensuring both high accuracy in positioning the hygroscopic pads 14, and a very gentle treatment of the hygroscopic pads 14 that fully preserves the integrity of the hygroscopic pads 14 themselves (thus ensuring at the same time an overall high production quality).

Also the application station S8 for applying the bases 5 is particularly effective and efficient and therefore allows to operate quickly (i.e. with a very high hourly productivity) while ensuring the integrity of all the components of the cartridges 2.

The manufacturing machine 15 described above has numerous advantages.

In the first place, the manufacturing machine 1 described above allows to achieve high hourly productivity (i.e. a number of pieces produced in the time unit) while ensuring a high standard quality of the cartridges 2.

In addition, the manufacturing machine 1 described above is also easy and inexpensive to produce, since it is composed of structurally simple elements needing few and easily implemented maneuvers.

Finally, the manufacturing machine 1 described above provides adequate maneuvering space around each component, and then both the initial assembly of the components and the subsequent maintenance are simplified (from the simple cleaning to the replacement) of the components themselves.

The invention claimed is:

1. A manufacturing machine (15) for producing a cartridge (3), for an electronic cigarette (1), comprising a supporting base (4) and at least one electrode (6, 7) fitted to the supporting base (4); the manufacturing machine (15) comprising:
 a conveyor (32) comprising a pocket (33) for feeding the supporting base (4) along a conveying path (P1);
 a gripping device (40) for gripping the electrode (6, 7); and
 an actuating device (41), which moves the gripping device (40) cyclically back and forth in a fitting direction (D1) perpendicular to the conveying path (P1), so as to fit the electrode (6, 7), gripped by the gripping device (40), to the supporting base (4) during a forward stroke, and to detach the gripping device (40) from the electrode (6, 7), fitted to the supporting base (4), during a return stroke;
 the manufacturing machine (15) being characterized by comprising:
 a feed device (28) for feeding a sheet metal strip (29) to the gripping device (40);
 a tool (44) located upstream from the gripping device (40), and which blanks the sheet metal strip (29) to form the electrode (6, 7) in the sheet metal strip (29), leaving part of the electrode (6, 7) contacting the rest of the sheet metal strip (29); and
 a cutting device (45) which cooperates with the gripping device (40) to detach the electrode (6, 7) from the rest of the sheet metal strip (29) when the gripping device (40) grips the electrode (6, 7).

2. A manufacturing machine (15) according to claim 1, wherein the tool (44) also shapes the sheet metal strip (29), so that parts of the electrode (6, 7) are folded.

3. A manufacturing machine (15) according to claim 1, wherein:
 the tool (44) blanking the sheet metal strip (29) forms at least two different electrodes (6, 7) in the sheet metal strip (29);
 at least two gripping devices (40) are provided, each for gripping and fitting a corresponding electrode (6, 7) to the supporting base (4); and
 two cutting devices (45) are provided, each cooperating with a corresponding gripping device (40).

4. A manufacturing machine (15) according to claim 3, wherein a single actuating device (41) is common to both gripping devices (40).

5. A manufacturing machine (15) according to claim 1, wherein:
 the tool (44) blanking the sheet metal strip (29) forms a succession of through guide holes (46) along an edge (43) of the sheet metal strip (29); and
 the feed device (28) comprises at least one sprocket wheel (47) located downstream from the tool (44), and which guides the sheet metal strip (29) by the sprockets on the wheel engaging the through guide holes (46) in the sheet metal strip (29).

6. A manufacturing machine (15) according to claim 5, wherein the sprocket wheel (47) is located close to the gripping device (40).

7. A manufacturing machine (15) according to claim 5, wherein the through guide holes (46) are circular, and the sprockets on the sprocket wheel (47) are hemispherical.

8. A manufacturing machine (15) according to claim 5, wherein the tool (44) blanking the sheet metal strip (29) makes a number of small transverse through cuts (46a) along the edge (43) of the sheet metal strip (29) to increase the flexibility of the sheet metal strip (29).

9. A manufacturing machine (15) according to claim 1, wherein the gripping device (40) comprises a gripper comprising two opposed jaws.

10. A manufacturing machine (15) according to claim 1, wherein the cutting device (45) is separate from and independent of the gripping device (40), so as to only detach the electrode (6, 7) from the rest of the sheet metal strip (29) after the gripping device (40) grips the electrode (6, 7).

11. A manufacturing machine (15) according to claim 1, wherein:
 two identical, redundant, independent fitting assemblies (48) are located one after the other along the conveying path (P1); and
 each fitting assembly (48) has its own gripping device (40), its own actuating device (41), its own feed device (28), its own tool (44), and its own cutting device (45).

12. A method of producing a cartridge (3), for an electronic cigarette (1), comprising a supporting base (4) and at least one electrode (6, 7) fitted to the supporting base (4); the method comprising the steps of:
 feeding the supporting base (4) along a conveying path (P1) by means of a conveyor (32) comprising a pocket (33);
 gripping the electrode (6, 7) by means of a gripping device (40); and
 moving the gripping device (40), by means of an actuating device (41), cyclically back and forth in a fitting direction (D1) perpendicular to the conveying path (P1), so as to fit the electrode (6, 7), gripped by the gripping device (40), to the supporting base (4) during a forward stroke, and to detach the gripping device (40) from the electrode (6, 7), fitted to the supporting base (4), during a return stroke;

the method being characterized by comprising the further steps of:

feeding a sheet metal strip (29) to the gripping device (40) by means of a feed device (28);

blanking the sheet metal strip (29), by means of a tool (44) located upstream from the gripping device (40), to form the electrode (6, 7) in the sheet metal strip (29), leaving part of the electrode (6, 7) contacting the rest of the sheet metal strip (29); and detaching the electrode (6, 7), by means of a cutting device (45) cooperating with the gripping device (40), from the rest of the sheet metal strip (29) when the gripping device (40) grips the electrode (6, 7).

* * * * *